United States Patent [19]
Khandros et al.

[11] Patent Number: 5,950,304
[45] Date of Patent: Sep. 14, 1999

[54] METHODS OF MAKING SEMICONDUCTOR CHIP ASSEMBLIES

[75] Inventors: Igor Y. Khandros, Orinda; Thomas H. Distefano, Monte Sereno, both of Calif.

[73] Assignee: Tessera, Inc., San Jose, Calif.

[21] Appl. No.: 08/861,280

[22] Filed: May 21, 1997

Related U.S. Application Data

[62] Continuation of application No. 08/319,966, Oct. 7, 1994, Pat. No. 5,685,885, which is a continuation of application No. 08/030,194, Apr. 28, 1993, filed as application No. PCT/US91/06920, Sep. 24, 1991, Pat. No. 5,679,977, said application No. 08/030,194, is a continuation of application No. 07/765,928, Sep. 24, 1991, Pat. No. 5,347,159, and a continuation-in-part of application No. 07/586,758, Sep. 24, 1990, Pat. No. 5,148,266, and application No. 07/673,020, Mar. 21, 1991, Pat. No. 5,148,265, said application No. 07/765,928, is a continuation-in-part of application No. 07/673,020, and application No. 07/586,758.

[51] Int. Cl.$^6$ .............................. H05K 13/04; H05K 3/30
[52] U.S. Cl. .................................. 29/831; 29/832; 29/840
[58] Field of Search .................................. 29/25.01, 831, 29/832, 842, 843, 844, 845, 840, 854, 830; 438/106, 107, 108, 613, 617; 257/700, 778, 773, 784, 786

[56] References Cited

U.S. PATENT DOCUMENTS

| | | |
|---|---|---|
| Re. 35,119 | 12/1995 | Blonder et al. . |
| T955,008 | 2/1977 | Gregor et al. . |
| 3,302,067 | 1/1967 | Jackson et al. . |

(List continued on next page.)

FOREIGN PATENT DOCUMENTS

| | | |
|---|---|---|
| 072673 | 8/1982 | European Pat. Off. . |
| 080041 | 9/1982 | European Pat. Off. . |
| 0 352 020 A3 | 7/1989 | European Pat. Off. . |

(List continued on next page.)

OTHER PUBLICATIONS

Nitto Product Information. "New Tab Mounting Method". IBM Technical Disclosure Bulletin. Jan. 1985, vol. 27, No. 9, p. 4855.

IBM Technical Disclosure Bulletin. "Non–Permanent Mounting Technique for Test and Burn–In of C4 Devices". Nov. 1990, vol. 33, No. 7.

IBM Technical Disclosure Bulletin. "Extended Pad for Testing Package Parts". Dec. 1984, vol. 27, No. 7B, pp. 4210–4211.

IBM Technical Disclosure Bulletin. "Test and Repair of Direct Chip Attach Modules". Aug. 1988, vol. 31, No. 3.

Microelectrics Packaging Handbook, 1989, pp. 420–423, 1132. Rao R. Tummala and Eugene J. Rymaszewski.

"Improved C4 Reliability Using Low Modulus Dielectric Layer", IBM Technical Disclosure bulletin, vol. 32, No. 6A, Nov. 1989.

"Methods of Testing Chips and Joining Chips to Substrates," 2244 Research Disclosure, Feb. 1991, Elmsworth, GB 32290.

*Primary Examiner*—S. Thomas Hughes
*Attorney, Agent, or Firm*—Lerner, David, Littenberg, Krumholz & Mentlik

[57] ABSTRACT

A semiconductor chip having contacts on the central region of its top surface is provided with a dielectric element overlying the central portion of the top surface. The dielectric element has a first surface facing toward the chip and a second surface facing away from the chip, a hole encompassing the central contacts and an edge bounding the hole. Central contact leads extend from the central contacts on the chip to central terminals on the dielectric element. The terminals on the dielectric element may be connected to a substrate using techniques commonly employed in surface mounting of electrical devices, such as solder bonding. The leads, and preferably the dielectric element, are flexible so that the terminals are moveable with respect to the contacts on the chip, to compensate for differential thermal expansion of the chip and substrate. The dielectric element may be provided with a compliant layer disposed between the terminals and the chip. The entire assembly is compact.

8 Claims, 19 Drawing Sheets

U.S. PATENT DOCUMENTS

| | | |
|---|---|---|
| 3,390,308 | 6/1968 | Marley . |
| 3,426,252 | 2/1969 | Lepselter . |
| 3,474,297 | 10/1969 | Bylander . |
| 3,487,541 | 1/1970 | Boswell . |
| 3,611,061 | 10/1971 | Segerman . |
| 3,614,832 | 10/1971 | Chance et al. . |
| 3,680,037 | 7/1972 | Nellis et al. . |
| 3,680,206 | 8/1972 | Roberts . |
| 3,683,105 | 8/1972 | Shamash et al. . |
| 3,689,991 | 9/1972 | Aird . |
| 3,724,068 | 4/1973 | Galli . |
| 3,772,575 | 11/1973 | Hegarty et al. . |
| 3,795,037 | 3/1974 | Luttmer . |
| 3,823,467 | 7/1974 | Shamash et al. . |
| 3,825,353 | 7/1974 | Loro . |
| 3,832,769 | 9/1974 | Olyphant, Jr. et al. . |
| 3,862,790 | 1/1975 | Davies et al. . |
| 3,864,728 | 2/1975 | Peltz et al. . |
| 3,868,724 | 2/1975 | Perrino . |
| 3,952,404 | 4/1976 | Matunami . |
| 4,179,802 | 12/1979 | Joshi et al. . |
| 4,189,825 | 2/1980 | Robillard et al. . |
| 4,237,607 | 12/1980 | Ohno . |
| 4,349,862 | 9/1982 | Bajorek et al. . |
| 4,356,374 | 10/1982 | Noyori et al. . |
| 4,410,905 | 10/1983 | Grabbe . |
| 4,437,141 | 3/1984 | Prokop . |
| 4,536,469 | 8/1985 | Alderstein . |
| 4,545,610 | 10/1985 | Lakritz et al. . |
| 4,574,470 | 3/1986 | Burt . |
| 4,597,617 | 7/1986 | Enochs . |
| 4,604,644 | 8/1986 | Beckham et al. . |
| 4,627,151 | 12/1986 | Mulholland et al. . |
| 4,628,406 | 12/1986 | Smith et al. . |
| 4,648,179 | 3/1987 | Bhattacharyya et al. . |
| 4,649,415 | 3/1987 | Hebert . |
| 4,655,524 | 4/1987 | Etzel . |
| 4,658,332 | 4/1987 | Baker et al. . |
| 4,667,220 | 5/1987 | Lee et al. . |
| 4,670,770 | 6/1987 | Tai . |
| 4,681,654 | 7/1987 | Clementi et al. . |
| 4,685,998 | 8/1987 | Quinn et al. . |
| 4,695,870 | 9/1987 | Patraw . |
| 4,700,473 | 10/1987 | Freyman et al. . |
| 4,709,468 | 12/1987 | Wilson . |
| 4,710,798 | 12/1987 | Marcantonio . |
| 4,721,993 | 1/1988 | Walter . |
| 4,751,199 | 6/1988 | Phy . |
| 4,751,482 | 6/1988 | Fukuta et al. . |
| 4,764,804 | 8/1988 | Sahara et al. . |
| 4,766,670 | 8/1988 | Godzik et al. . |
| 4,772,936 | 9/1988 | Reding et al. . |
| 4,783,695 | 11/1988 | Eichelberger et al. . |
| 4,783,719 | 11/1988 | Jamison et al. . |
| 4,793,814 | 12/1988 | Zifcak et al. . |
| 4,796,078 | 1/1989 | Phelps, Jr. et al. . |
| 4,811,082 | 3/1989 | Jacobs et al. . |
| 4,814,295 | 3/1989 | Mehta . |
| 4,818,728 | 4/1989 | Rai et al. . |
| 4,842,662 | 6/1989 | Jacobi . |
| 4,847,146 | 7/1989 | Yeh et al. . |
| 4,855,867 | 8/1989 | Gazdik et al. . |
| 4,855,872 | 8/1989 | Wojnar et al. . |
| 4,860,088 | 8/1989 | Smith et al. . |
| 4,866,841 | 9/1989 | Hubbard . |
| 4,874,721 | 10/1989 | Kimura et al. . |
| 4,878,098 | 10/1989 | Saito et al. . |
| 4,884,122 | 11/1989 | Eichelberger et al. . |
| 4,887,148 | 12/1989 | Mu . |
| 4,890,157 | 12/1989 | Wilson . |
| 4,893,172 | 1/1990 | Matsumoto et al. . |
| 4,897,534 | 1/1990 | Haghiri-Tehrani . |
| 4,918,811 | 4/1990 | Eichelberger et al. . |
| 4,924,353 | 5/1990 | Patraw . |
| 4,926,241 | 5/1990 | Carey . |
| 4,937,203 | 6/1990 | Eichelberger et al. . |
| 4,937,653 | 6/1990 | Blonder et al. . |
| 4,937,707 | 6/1990 | McBride et al. . |
| 4,941,033 | 7/1990 | Kishida . |
| 4,942,140 | 7/1990 | Ootsuki et al. . |
| 4,954,878 | 9/1990 | Fox et al. . |
| 4,967,261 | 10/1990 | Niki et al. . |
| 4,975,765 | 12/1990 | Ackermann et al. . |
| 4,989,069 | 1/1991 | Hawkins . |
| 4,993,954 | 2/1991 | Prevost . |
| 5,006,673 | 4/1991 | Freyman et al. . |
| 5,019,673 | 5/1991 | Juskey et al. . |
| 5,023,205 | 6/1991 | Reche . |
| 5,027,191 | 6/1991 | Bourdelaise et al. . |
| 5,029,325 | 7/1991 | Higgins, III et al. . |
| 5,045,921 | 9/1991 | Lin et al. . |
| 5,045,922 | 9/1991 | Kodama et al. . |
| 5,053,922 | 10/1991 | Matta et al. . |
| 5,055,907 | 10/1991 | Jacobs . |
| 5,055,913 | 10/1991 | Haghiri-Tehrani . |
| 5,086,337 | 2/1992 | Noro et al. . |
| 5,117,275 | 5/1992 | Bregman . |
| 5,123,850 | 6/1992 | Elder et al. . |
| 5,136,366 | 8/1992 | Worp et al. . |
| 5,148,265 | 9/1992 | Khandros et al. . |
| 5,148,266 | 9/1992 | Khandros et al. . |
| 5,192,716 | 3/1993 | Jacobs . |
| 5,210,939 | 5/1993 | Mallik et al. . |
| 5,217,916 | 6/1993 | Anderson et al. . |
| 5,222,014 | 6/1993 | Lin . |
| 5,227,583 | 7/1993 | Jones ..................................... 29/854 X |
| 5,282,312 | 2/1994 | DiStefano et al. . |
| 5,289,346 | 2/1994 | Carey et al. . |
| 5,346,861 | 9/1994 | Khandros et al. . |
| 5,347,159 | 9/1994 | Khandros et al. . |
| 5,350,947 | 9/1994 | Takekawa et al. . |
| 5,379,191 | 1/1995 | Carey et al. . |
| 5,394,009 | 2/1995 | Loo ..................................... 257/778 X |
| 5,414,298 | 5/1995 | Grube et al. . |
| 5,454,160 | 10/1995 | Nickel ................................ 257/778 X |
| 5,477,082 | 12/1995 | Buckley, III et al. ............... 257/778 X |
| 5,504,035 | 4/1996 | Rostoker et al. .................... 438/106 X |
| 5,518,964 | 5/1996 | DiStefano et al. . |
| 5,637,919 | 6/1997 | Grabbe ................................ 257/778 X |

FOREIGN PATENT DOCUMENTS

| | | |
|---|---|---|
| 413451 | 7/1990 | European Pat. Off. . |
| 245179 | 2/1995 | European Pat. Off. . |
| 2405839 | 12/1981 | France . |
| 2495839 | 12/1981 | France . |
| 2586885 | 8/1986 | France . |
| 2586885 | 8/1996 | France . |
| 60-217641 | 10/1985 | Japan . |
| 1-155633 | 6/1989 | Japan . |
| 1-293528 | 11/1989 | Japan . |
| 1003396 | 3/1983 | U.S.S.R. . |
| 8910005 | 10/1989 | WIPO . |
| WO 89/12911 | 12/1989 | WIPO . |
| 9112706 | 8/1991 | WIPO . |

OTHER PUBLICATIONS

IBM Technical Disclosure Bulletin entitled "Design For Minimum Chip Joint Street", Dec. 1989, vol. 32, No. 7.

IBM Technical Disclosure Bulletin entitled Improved C4 Reliability Using Law Modulus Dielectric Layer, Nov. 1989, vol. 32, No. 6A.

METHODS OF MAKING SEMICONDUCTOR CHIP ASSEMBLIES

CROSS REFERENCE TO RELATED APPLICATIONS

This is a continuation of U.S. patent application Ser. No. 08/319,966, filed on Oct. 7, 1994 and now U.S. Pat. No. 5,685,885, which is in turn a continuation of U.S. patent application Ser. No. 08/030,194, filed Apr. 28, 1993 as the national phase of International Application PCTUS/91/06920 filed Sep. 24, 1991 and now U.S. Pat. No. 5,679,977. Said application Ser. No. 030,194 in turn is a continuation of U.S. patent application Ser. No. 07/765,928, filed Sep. 24, 1991 now U.S. Pat. No. 5,347,159. Said application Ser. No. 07/765,928 in turn was a continuation-in-part of U.S. patent application Ser. No. 07/673,020, filed Mar. 21, 1991, now U.S. Pat. No. 5,148,265 and said application Ser. No. 07/765,928 was a continuation-in-part of U.S. patent application Ser. No. 07/586,758, filed Sep. 24, 1990, now U.S. Pat. No. 5,148,266. Said U.S. patent application Ser. No. 08/030,194 is also a continuation-in-part of said application Ser. Nos. 07/586,758 and 07/673,020.

TECHNICAL FIELD

The present invention relates to the art of electronic packaging, and more specifically to assemblies incorporating semiconductor chips and to methods and components useful in making such assemblies.

BACKGROUND OF THE INVENTION

Modern electronic devices utilize semiconductor chips, commonly referred to as "integrated circuits" which incorporate numerous electronic elements. These chips are mounted on substrates which physically support the chips and electrically interconnect each chip with other elements of the circuit. The substrate may be a part of a discrete chip package used to hold a single chip and equipped with terminals for interconnection to external circuit elements. Such substrates may be secured to an external circuit board or chassis. Alternatively, in a so-called "hybrid circuit" one or more chips are mounted directly to a substrate forming a circuit panel arranged to interconnect the chips and the other circuit elements mounted to the substrate. In either case, the chip must be securely held on the substrate and must be provided with reliable electrical interconnection to the substrate. The interconnection between the chip itself and its supporting substrate is commonly referred to as "first level" assembly or chip interconnection, as distinguished from the interconnection between the substrate and the larger elements of the circuit, commonly referred to as a "second level" interconnection.

The structures utilized to provide the first level connection between the chip and the substrate must accommodate all of the required electrical interconnections to the chip. The number of connections to external circuit elements, commonly referred to as "input-output" or "I/O" connections, is determined by the structure and function of the chip. Advanced chips capable of performing numerous functions may require substantial numbers of I/O connections.

The size of the chip and substrate assembly is a major concern. The size of each such assembly influences the size of the overall electronic device. More compact assemblies, with smaller distances between chips provide smaller signal transmission delays and hence permit faster operation of the devise.

First level interconnection structures connecting a chip to a substrate ordinarily are subject to substantial strain caused by thermal cycling as temperatures within the device change during operation. The electrical power dissipated within the chip tends to heat the chip and substrate, so that the temperatures of the chip and substrate rise each time the device is turned on and fall each time the device is turned off. As the chip and the substrate ordinarily are formed from different materials having different coefficients of thermal expansion, the chip and substrate ordinarily expand and contract by different amounts. This causes the electrical contacts on the chip to move relative to the electrical contact pads on the substrate as the temperature of the chip and substrate changes. This relative movement deforms the electrical interconnections between the chip and substrate and places them under mechanical stress. These stresses are applied repeatedly with repeated operation of the device, and can cause breakage of the electrical interconnections. Thermal cycling stresses may occur even where the chip and substrate are formed from like materials having similar coefficients of thermal expansion, because the temperature of the chip may increase more rapidly than the temperature of the substrate when power is first applied to the chip.

The cost of the chip and substrate assembly is also a major concern. All these concerns, taken together, present a formidable engineering challenge. Various attempts have been made heretofore to provide primary interconnection structures and methods to meet these concerns, but none of these is truly satisfactory in every respect. At present, the most widely utilized primary interconnection methods are wire bonding, tape automated bonding or "TAB" and flip-chip bonding.

In wire bonding, the substrate has a top surface with a plurality of electrically conductive contact pads or lands disposed in a ring-like pattern, The chip is secured to the top surface of the substrate at the center of the ring-like pattern, so that the chip is surrounded by the contact pads on the substrate. The chip is mounted in a face-up disposition, with the back surface of the chip confronting the top surface of the substrate and with the front surface of the chip facing upwardly, away from the substrate, so that electrical contacts on the front surface are exposed. Fine wires are connected between the contacts on the front face of the chip and the contact pads on the top surface of the substrate. These wires extend outwardly from the chip to the surrounding contact pads on the substrate. In the wire bonded assemblies, the area of the substrate occupied by the chip, the wires and the contact pads of the substrate is substantially greater than the surface area of the chip itself.

In tape automated bonding, a polymer tape is provided with thin layers of metallic material forming conductors on a first surface of the tape. These conductors are arranged generally in a ring-like pattern and extend generally radially, towards and away from the center of the ring-like pattern. The chip is placed on the tape in a face down arrangement, with contacts on the front surface of the chip confronting the conductors on the first surface of the tape. The contacts on the chip are bonded to the conductors on the tape. Ordinarily, numerous patterns of conductors are arranged along the length of the tape and one chip is bonded to each of these individual patterns, so that the chips, once bonded to the tape, can be advanced through successive work stations by advancing the tape. After each chip is bonded to the metallic conductors constituting one pattern, the chip and the immediately adjacent portions of the pattern are encapsulated and the outermost portions of the metallic conductors are secured to additional leads and to the ultimate substrate.

Tape automated bonding can provide the assembly with good resistance to thermal stresses, because the thin metallic leads on the tape surface are quite flexible, and will bend readily upon expansion of the chip without imposing significant stresses at the juncture between the lead and the contact on the chip. However, because the leads utilized in tape automated bonding extend outwardly in a radial, "fan out" pattern from the chip, the assembly is much larger than the chip itself.

In flip-chip bonding, contacts on the front surface of the chip are provided with bumps of solder. The substrate has contact pads arranged in an array corresponding to the array of contacts on the chip. The chip, with the solder bumps, is inverted so that its front surface faces toward the top surface of the substrate, with each contact and solder bump on the chip being positioned on the appropriate contact pad of the substrate. The assembly is then heated so as to liquify the solder and bond each contact on the chip to the confronting contact pad of the substrate. Because the flip-chip arrangement does not require leads arranged in a fan-out pattern, it provides a compact assembly. The area of the substrate occupied by the contact pads is approximately the same size as the chip itself. Moreover, the flip-chip bonding approach is not limited to contacts on the periphery of the chip. Rather, the contacts on the chip may be arranged in a so-called "area array" covering substantially the entire front face of the chip. Flip-chip bonding therefore is well suited to use with chips having large numbers of I/O contacts. However, assemblies made by flip-chip bonding are quite susceptible to thermal stresses. The solder interconnections are relatively inflexible, and may be subjected to very high stress upon differential expansion of the chip and substrate. These difficulties are particularly pronounced with relatively large chips. Moreover, it is difficult to test and operate or "burn-in" chips having an area array of contacts before attaching the chip to the substrate. Additionally, flip-chip bonding ordinarily requires that the contacts on the chip be arranged in an area array to provide adequate spacing for the solder bumps. Flip-chip bonding normally cannot be applied to chips originally designed for wire bonding or tape automated bonding, and having rows of closely spaced contacts on the periphery of the chip.

SUMMARY OF THE INVENTION

One aspect of the present invention provides a semiconductor chip assembly. An assembly according to this aspect of the invention typically includes a semiconductor chip having a plurality of surfaces and having contacts on at least one of said surfaces. The assembly further includes a sheetlike, preferably flexible, element having terminals thereon, the terminals being electrically connected to the contacts on the chip. Assemblies according to this aspect of the invention are characterized in that the sheetlike element and at least some of said terminals overly one surface of said chip, said terminals are movable with respect to said chip and in that resilient means for permitting displacement of the terminals toward the chip, but resisting such displacement are provided. Most preferably, a compliant layer is disposed between said terminals and said chip so that said compliant layer will be compressed upon movement of said terminals toward said chip.

The complaint layer may be incorporated in the sheetlike element, or formed separately therefrom. The contacts typically are disposed on the front or top surface of the chip. The sheetlike element and terminals may overlie said front surface of the chip. Alternatively, the sheetlike element and said terminals may overlie the rear, or bottom surface of said chip. The terminals on the sheetlike element can be connected to contact pads on a substrate, as by solder bonding. Because the terminals, and hence the contact pads on the substrate overlie the chip front or back surface, the assembly is compact. The ability of the terminals to move with respect to the chip in directions parallel to the chip surfaces provides compensation for differential thermal expansion of the chip and substrate.

The ability to accumulate movement of the terminals towards the face of the chip greatly facilitates temporary engagement of the terminals by test equipment and hence facilitates testing and "burn-in" of the assembly before the same is mounted to a substrate. According to a further aspect of the present invention the compliant layer includes masses of compliant material interspersed with holes. Desirably, each such mass is aligned with one of the terminals.

A further aspect of the invention provides method of making a semiconductor chip assembly including the step of assembling a flexible, sheetlike element having terminals thereon to a semiconductor chip and connecting terminals on said sheetlike element to contacts on said chip. Methods according to this aspect of the invention desirably are characterized in that the assembling step is conducted so that said terminals on said sheetlike element overlie a surface of the chip and in that a compliant layer is disposed between said chip and said terminals. Most preferably, these methods are further characterized by the step of testing the chip by establishing temporary electrical contact between a plurality of test probes and said terminals and utilizing said temporary electrical contact to actuate said chip. The compliant layer permits displacement of at least some of said central terminals toward said chip during the step of establishing temporary electrical contact. The step of establishing temporary electrical contact preferably includes the step of simultaneously establishing temporary contact between a plurality of terminals and a plurality of test probes rigidly connected to a test fixture.

Further aspects of the invention provide components for assembly to a semiconductor chip including a flexible sheetlike element having terminals thereon, characterized by a compliant layer underlying said terminals. The compliant layer preferably includes masses of a low modulus material and holes interspersed with said masses of low modulus material, said masses of said low modulus material being aligned with said terminals, said holes in said compliant layer being out of alignment with said terminals.

A chip assembly according to a further aspect of the invention includes a semiconductor chip having a front surface with a plurality of contacts disposed in a pattern on the front surface. The pattern of contacts on the front surface encompasses an area, referred to herein as the "contact pattern area" on the front surface. The chip assembly according to this aspect of the invention also includes a sheetlike dielectric element, referred to herein as "interposer", overlying the front surface of the chip. The interposer has a first surface facing toward the chip and a second surface facing away from the chip. An area of the interposer overlies the contact pattern area of the chip. The interposer has apertures extending through it, from the first surface to the second surface. The interposer also has a plurality of electrically conductive terminals disposed in a pattern on the second surface of the interposer. At least some of these terminals, and preferably most or all of these terminals, are disposed within the area of the interposer overlying the contact pattern area on the chip. Each such terminal is associated with one contact on the chip.

The assembly also includes flexible, electrically conductive leads. The leads preferably extend through the apertures in the interposer. Each such lead has a contact end connected to the associated contact of the chip and a terminal end connected to the associated terminal on the second surface of the interposer. The leads and the interposer are constructed and arranged so that the contact ends of the leads are moveable relative to the terminals at least to the extent required to compensate for differential thermal expansion of components. The leads desirably are flexible to permit such movement. Most preferably, the interposer itself is flexible so as to facilitate such movement. The assembly according to this aspect of the invention optionally may include a compliant layer as discussed above.

The assembly incorporating the chip, interposer, terminals and leads may be incorporated in a larger assembly including a substrate having a top surface facing toward the second surface of the interposer.

Preferred chip assemblies according to this aspect of the present invention are compact and may be utilized with chips having large numbers of input-output connections. The terminals on the interposer, and the corresponding contact pads on the substrate, desirably are disposed in areas substantially the same size as the contact pattern area on the chip itself.

The flexible leads may be formed integrally with the terminals on the interposer, or else may be separately formed fine wires. The leads desirably are curved to provide increased flexibility. The interposer desirably is a thin, flexible sheet of a polymeric material such as polymide, a fluoropolymer, a thermoplastic polymer or an elastomer. In this arrangement, flexing of the interposer facilitates movement of the contact ends of the leads relative to the terminals and thus contributes to the ability of the assembly to withstand thermal cycling. The assembly may also include a compliant dielectric encapsulant having a low elastic modulus, such as an elastomeric encapsulant, covering the flexible leads in whole or in part. The encapsulant may be provided in the form of a layer, with holes in the encapsulant layer aligned with the terminals on the second surface of the interposer. The bonds between the terminals and the contact pads of the substrate extend through these holes. The encapsulant protects the relatively delicate leads during handling and during service, but does not prevent flexing of the leads or the absorption by the leads of relative motion of the chip and substrate during thermal expansion.

A chip assembly according to yet another aspect of the present invention incorporates a chip having a front surface including a central region and a peripheral region surrounding the central region, the chip having a plurality of peripheral contacts disposed in the peripheral region of the front surface. The assembly preferably further includes a sheet-like dielectric interposer overlying the central region of the chip front surface. The interposer has a first surface facing downwardly toward the chip and a second surface facing upwardly, away from the chip. The interposer also has edges disposed inwardly of the peripheral contacts. For example, the interposer may overly only the central portion of the chip front surface. A plurality of central terminals are disposed on the interposer and overly the central region of the chip front surface. The assembly preferably also includes a plurality of peripheral contact leads connecting at least some of the peripheral contacts on the chip with at least some of the central terminals on the interposer. Each such peripheral contact lead thus has a central terminal end overlying the interposer and connected to one of the central terminals and a contact end projecting outwardly beyond one of the edges of the interposer and connected to one of the peripheral contacts. Each peripheral contact lead extends inwardly from one of the peripheral contacts to one of the central terminals on the interposer. The peripheral contact leads and preferably the interposer as well are at least partially flexible so that the central terminals are movable with respect to peripheral contacts to accommodate movement caused by differential thermal expansion. Here again, the assembly may optionally include a compliant layer as discussed above. Desirably, the peripheral contact leads include bent portions.

The peripheral contact leads and central terminals provide a "fan-in" arrangement in which the terminals on the interposer are disposed inside the region bounded by the peripheral contacts on the chip. Typically, the peripheral contacts on the chip are disposed in one or two rows along each edge of the chip, in a generally rectangular pattern, so that the contacts on the chip are close to one another. By contrast, the terminals on the interposer may be substantially evenly disposed over the second surface of the interposer. The central terminals may be disposed in a so-called "area array". Accordingly, the distance between adjacent terminals may be substantially greater than the distance between adjacent contacts on the chip. The distances between adjacent terminals on the interposer may be large enough to accommodate solder bonding and similar processes which require substantial distances between adjacent bonds.

Some or all of the peripheral contact lead may have outward extensions projecting outwardly beyond the peripheral contacts of the chip. The assembly may include securement means for holding these outward extensions. For example, one or more securement elements may be disposed outwardly of the peripheral contacts, and each such securement element may be physically connected to a plurality of the outward extensions on the peripheral contact leads. Each such securement element may be a generally planar strip of dielectric material having an inboard edge extending generally parallel to one of the edges of the interposer so that each pair of parallel edges define an elongated slot between each such securement element and the interposer, and each peripheral contact lead may extend across one of these slots. In this arrangement, the peripheral contacts of the chip may be disposed in alignment with the slots between the securement elements and the interposer. The securement element may be physically connected to the interposer, as by bridge elements extending between the securement elements and the interposer at spaced-apart locations around the periphery of the chip front surface. The securement elements, bridge elements and interposer may be formed integrally with one another as a single, sheet-like unit. The securement elements provide physical reenforcement to the peripheral contact leads during the manufacturing operations and in service. Additional terminals, referred to herein as "outside" terminals, may be disposed on the securement elements, and may be connected to some of the peripheral contacts on the chip by outside terminal leads extending across the slots, the inboard ends of the outside terminal leads being secured to the interposer so that the slot and interposer cooperatively provide reinforcement to the outside terminal leads as well.

These assemblies may be made by methods which include the step of assembling a sheet-like dielectric interposer to the chip so that the interposer overlies the central region of the chip front surface, the outboard edges of the interposer being disposed inwardly of the peripheral contacts on the chip. When the dielectric interposer is disposed on the chip, a first surface of the interposer faces downwardly toward the chip and a second surface of the interposer faces upwardly away from the chip, and a plurality of central terminals on the interposer overly the central region of the chip front surface. The method further includes the step of connecting a plurality of peripheral contact leads between at least some of the peripheral contacts of the chip and at least some of the central terminals on the interposer, so that each such peripheral contact lead extends inwardly from one of the peripheral contacts on the chip to one of the central terminals on the interposer. The method may further include the step of assembling a substrate having a plurality of contact pads to be assembled interposer and chip and connecting each of the central terminals on the interposer to one of the contact pads on the substrate.

The interposer may have prefabricated leads mounted thereon and connected to the central terminals before the interposer is assembled to the chip. In this case, the prefabricated contact leads are positioned on the chip when the interposer is assembled to the chip. Such prefabricated contact leads may be electrically connected to the contacts of the chip by thermocompression bonding or similar processes. Alternatively, the peripheral contact leads may be formed after the interposer is applied to the chip, as in a wire-bonding step in which a fine wire is dispensed and formed into a lead connecting the contact and terminal. Preferably, securement elements are provided as discussed above with reference to the chip assembly, and the securement elements are connected to the interposer before the interposer is placed on the chip. In this case, the securement elements may support the prefabricated leads during the step of placing the interposer on the chip.

A semiconductor chip assembly in accordance with yet another aspect of the invention includes a semiconductor chip having oppositely facing front and rear surfaces with edges extending between these surfaces, the chip having contacts on the front surface. The assembly further includes a generally sheet-like element referred to herein as "backing element" underlying the chip, the backing element having a top surface facing toward the chip and a bottom surface facing away from the chip. A central region of the backing element is aligned with the chip. The backing element is provided with terminals. At least some, and preferably all of the terminals on the backing element are disposed in the central region, so that the terminals underlie the bottom surface of the chip. The assembly in accordance with this aspect of the present invention further includes electrically conductive leads interconnecting the contacts on the chip front surface with the terminals on the backing element, these leads extending alongside the edges of the chip. Preferably, the backing element and the leads are flexible so that the terminals on the backing element are moveable with respect to the chip. Thus, the terminals desirably are moveable with respect to the contacts on the front surface of the chip in directions parallel to the plane of the chip top and bottom surfaces. The backing element and leads provide for connection to the chip at the back surface, so that the chip can be mounted in face-up disposition on a substrate. However, because the terminals on the backing element are disposed in the central region and aligned with the chip itself, the connections to the substrate can be made in the area beneath the chip. Therefore, the assembly need not be substantially larger than the chip itself.

The ability to accommodate relative movement between the chip and the terminals on the backing element allows the assembly to accommodate differential thermal expansion between the chip and substrate. Desirably, the terminals on the backing elements are also moveable relative to the chip in directions toward the bottom surface of the chip as discussed above, and the assembly may include resilient means for permitting movement of the terminals towards the bottom surface but resisting such movement. For example, the assembly may incorporate a layer of a compliant material disposed between the chip rear surface and the terminals.

Most desirably, the assembly includes at least one generally sheet-like flap connected to the backing element. Each such flap extends upwardly, towards the front surface of the chip and away from the backing element alongside one edge of the chip. Each of the aforementioned leads desirably includes a flap portion extending along one of these flaps. The flaps may be formed integrally with the backing element. Desirably, both of the flaps and the backing element include electrically conductive layers and a dielectric layer disposed between the electrically conductive layers and the leads so as to provide a controlled impedance in the leads. Assemblies of this type are especially well suited to use with chips having contacts arranged in rows adjacent the periphery of the chip front surface peripherate. Desirably, each flap extends to the vicinity of at least one row of contacts. The flap portions of the leads on each such flap are connected to the adjacent row of contacts. Such connection may be made for instance by wire bonding or by direct connections between the flap portions of the leads and the contacts on the chip. Even where wire bonding is employed, however, the wires extending between the chip contacts and the flap portions of the leads are short. Such short wire bonds can be readily applied and have relatively low inductance.

Most preferably, the chip assembly includes one or more support elements disposed between the flaps and the edges of the chip. The support elements may cooperatively constitute a ring or box surrounding the chip. The box may also incorporate a floor element disposed beneath the rear surface of the chip, between the rear surface and the backing element. Where the assembly includes a floor element underlying the chip rear surface, the compliant layer may be disposed between the floor element and the terminals, as, for example, between the floor element and the backing element. These arrangements provide for mechanical support of the flaps and protection of the interconnections. Further protection may be afforded by encapsulating the assembly.

Further aspects of the invention provide components incorporating subassemblies of the backing element, leads and support element. Preferably, these components include support elements defining a box, and include flaps integral with the backing element extending upwardly along the sides of the box. The conductors extending along the flaps are prepositioned adjacent the top edges of the box walls. In manufacture of the assembly, the chip may be placed within the box and the conductors may be joined to the chip terminals.

Assemblies as discussed above may be incorporated in a larger assembly with a substrate having contact pads, the contact pads of the substrate being aligned with the terminals on the backing element and connected thereto. Such connection may be made for example by masses of electrically conductive bonding material disposed between the terminals and the contact pads of the substrate.

A further aspect of the present invention provides a circuit assembly including a plurality of chip assemblies, each including an interposer and a backing element as discussed above. According to this aspect of the invention, the chip assemblies may be arranged in a stack, one on top of the other, such that each chip assembly other than the bottommost chip assembly overlies another, immediately subjacent chip assembly. The bottom surface of the backing element in each such overlying chip assembly faces the second surface of the interposer of the immediate subjacent chip assembly.

Most preferably, at least some of the inside terminals on the backing element of each such overlying chip assembly are connected to the central terminals on the interposer of the immediately subjacent chip assembly, so that the chips of the various chip assemblies are electrically connected to one another.

Further aspects, features and advantages of the present invention will be more readily apparent from the detailed description of the preferred embodiments set forth below, taken in conjunction with the accompanying drawings.

Figure 1:
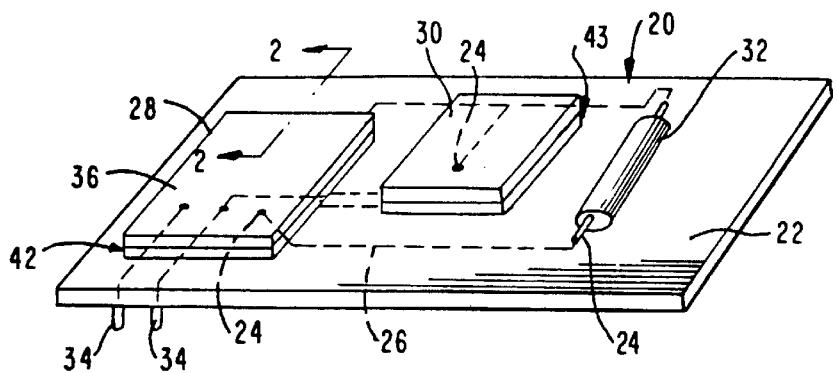
FIG. 1 is a diagrammatic perspective view of a chip assembly in accordance with one embodiment of the invention.
Figure 6:
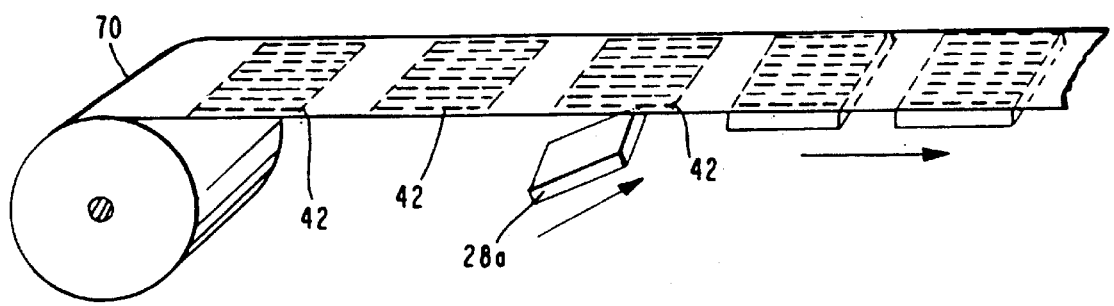
Figure 7:
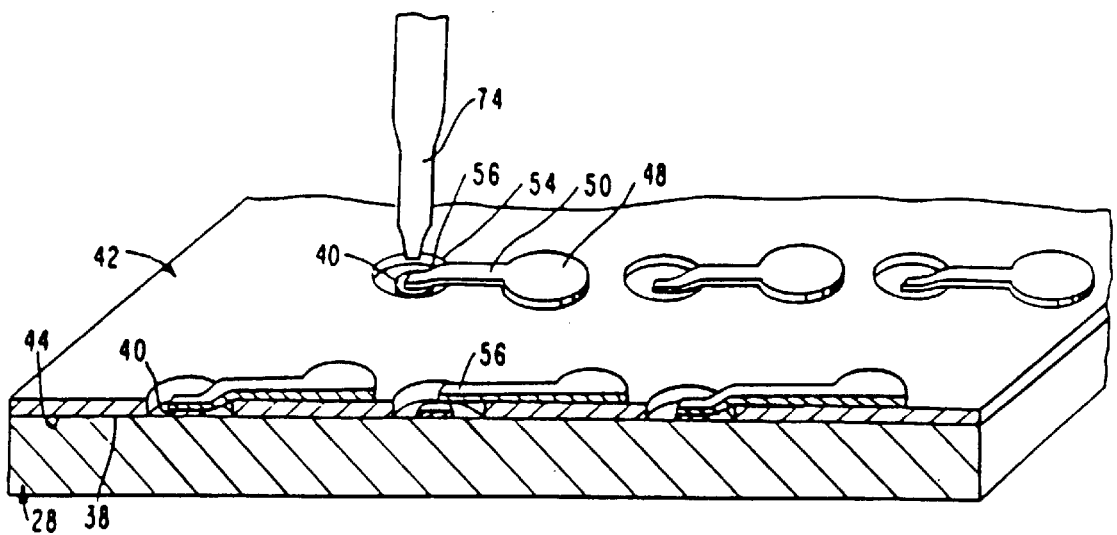
Figure 8:
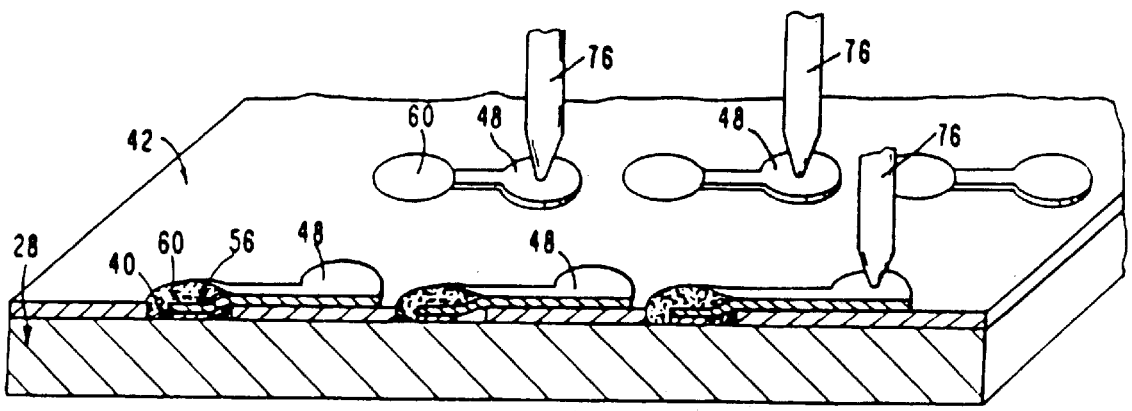

Each of FIGS. 6, 7 and 8 is a fragmentary diagrammatic perspective view depicting certain operations in the process of manufacture of the assembly of FIG. 1.

Figure 9:
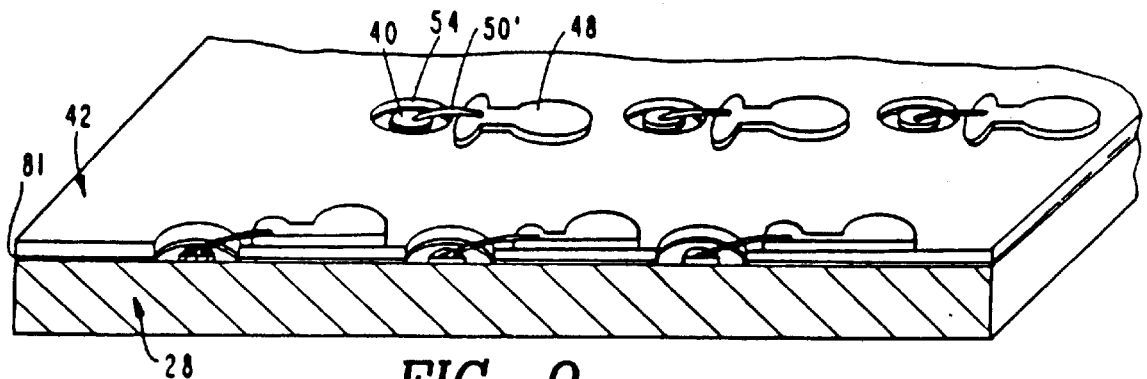

FIG. 9 is a fragmentary diagrammatic perspective view similar to FIG. 7 but depicting components and process steps in accordance with a further embodiment of the invention.

Each of FIGS. 10A through 10E is a fragmentary diagrammatic perspective view depicting a stage in a further component fabrication process according to the invention.

Figure 11:
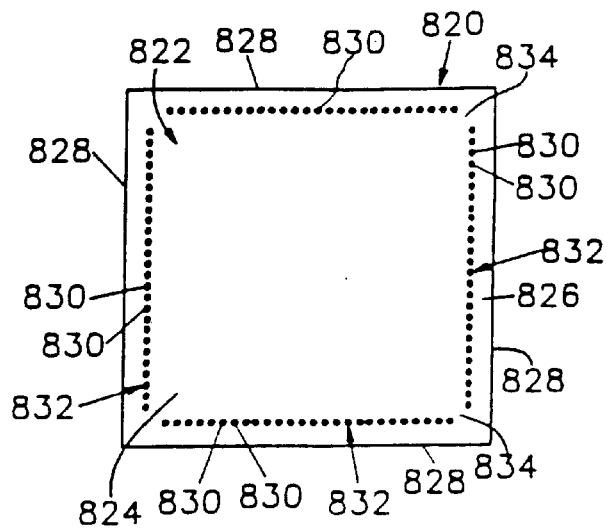

FIG. 11 is a diagrammatic plan view of a semiconductor chip incorporated in one embodiment of the present invention.

Figure 12:
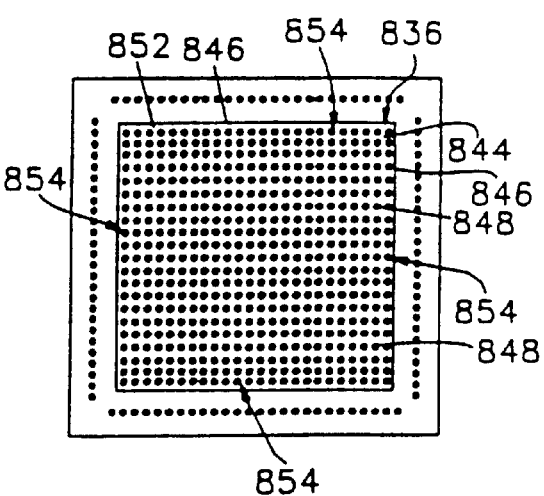

FIG. 12 is a view similar to FIG. 11 but showing the chip in conjunction with additional components.

Figure 13:
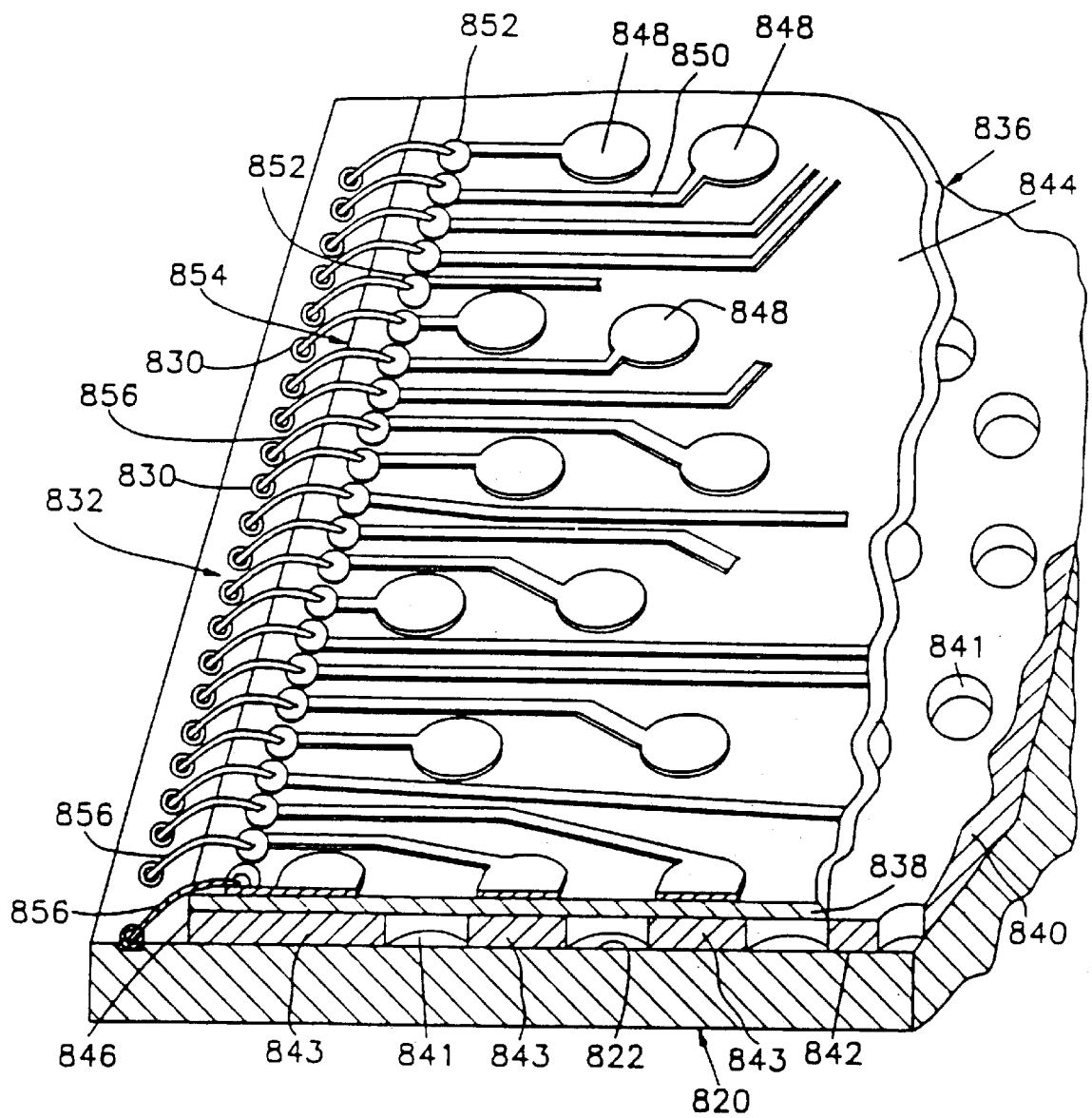

FIG. 13 is a fragmentary, partially sectional perspective view on an enlarged scale depicting portions of the components illustrated in FIG. 12.

Figure 14:
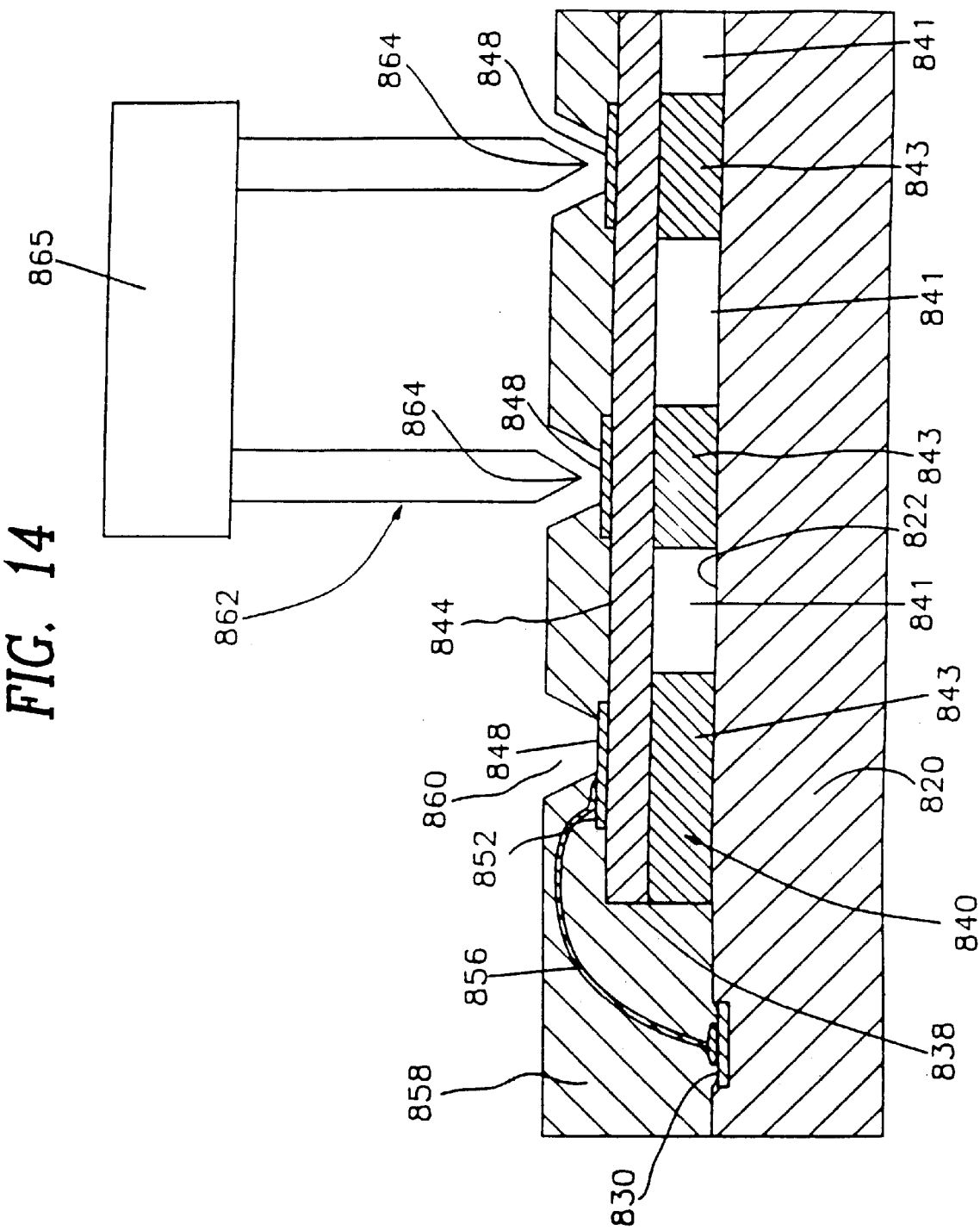

FIG. 14 is a fragmentary, diagrammatic sectional view depicting the components shown in FIG. 13 together with additional components and process equipment.

Figure 15:
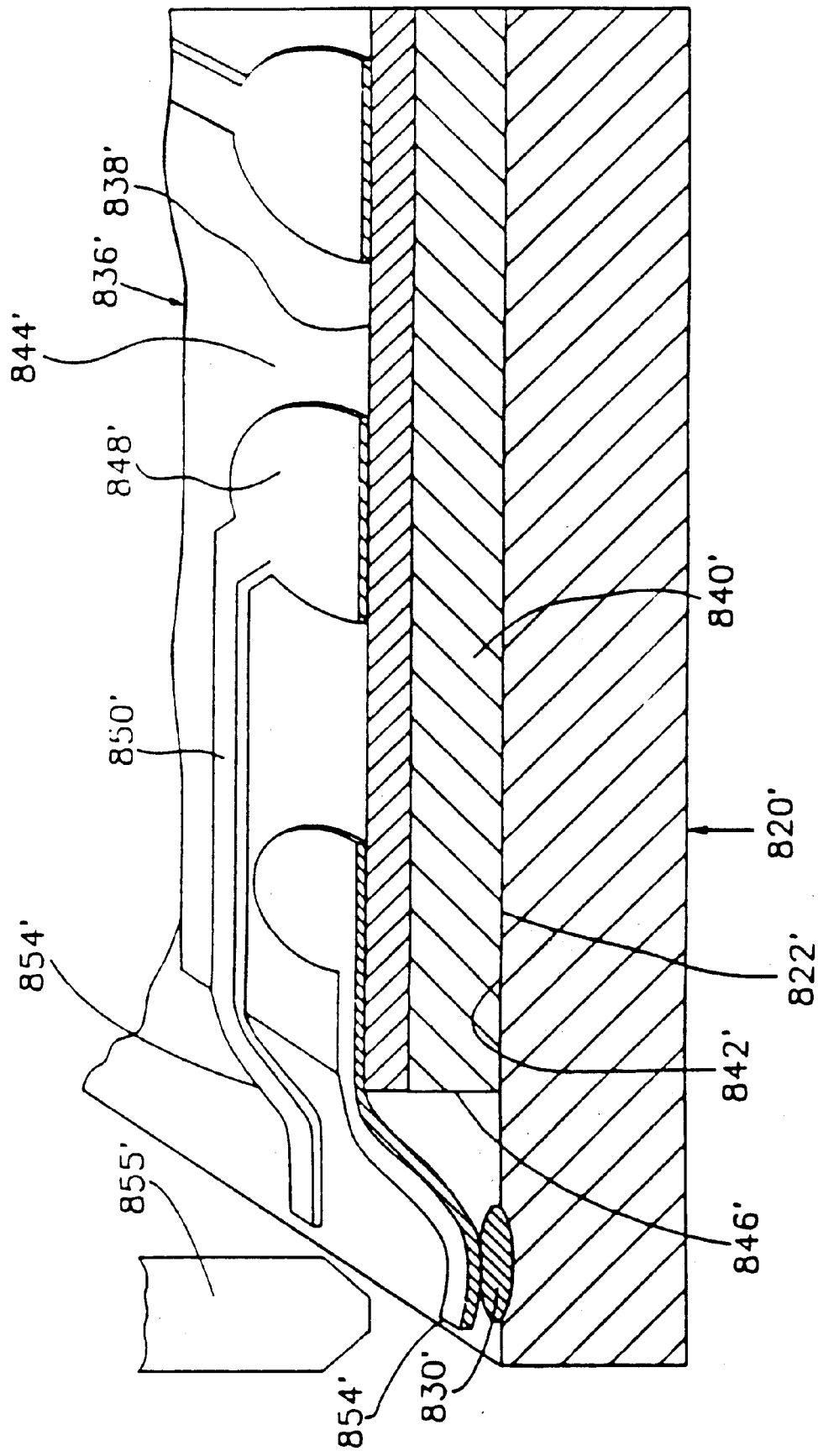

FIG. 15 is a fragmentary, diagrammatic sectional view depicting an assembly operation according to a further embodiment of the invention.

Figure 16:
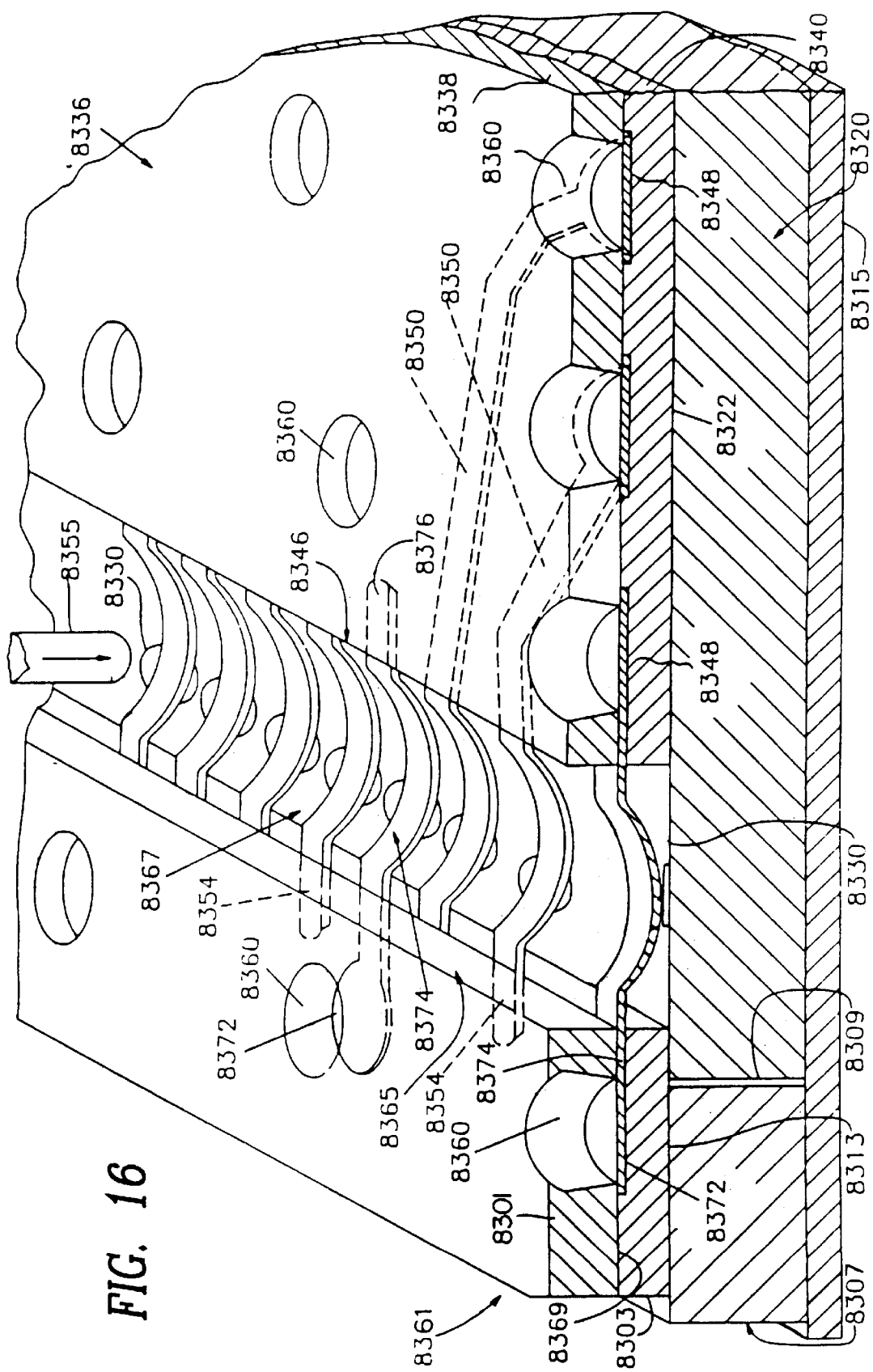

FIG. 16 is a fragmentary, partially sectional diagrammatic perspective view depicting an assembly according to a further embodiment of the invention.

Figure 17:
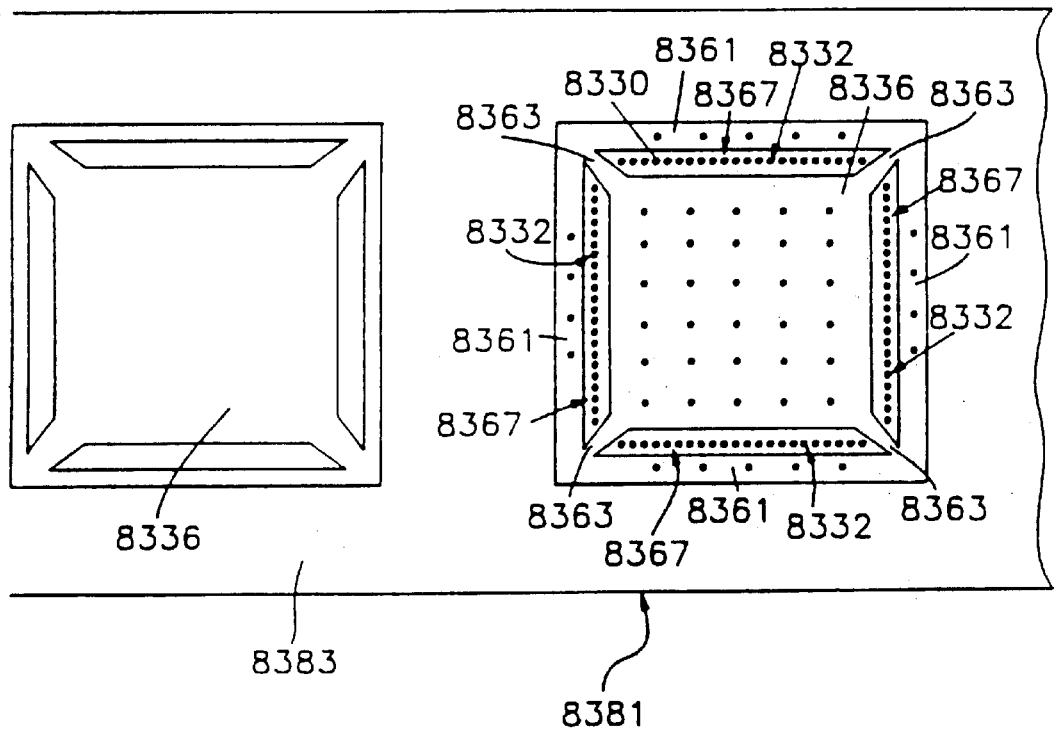

FIG. 17 is a diagrammatic plane view depicting the assembly of FIG. 16.

Figure 18:
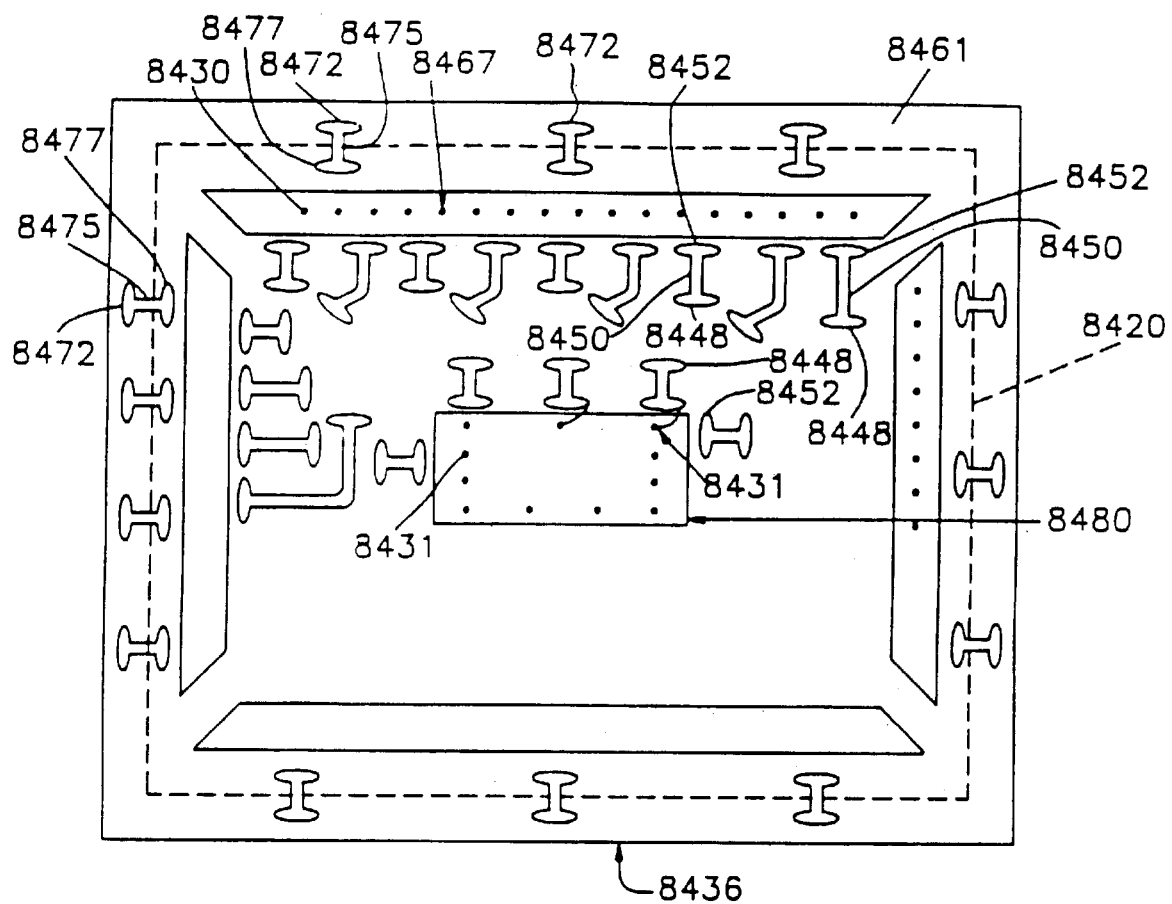

FIG. 18 is a diagrammatic plan view depicting an assembly according to yet another embodiment of the invention.

Figure 19:
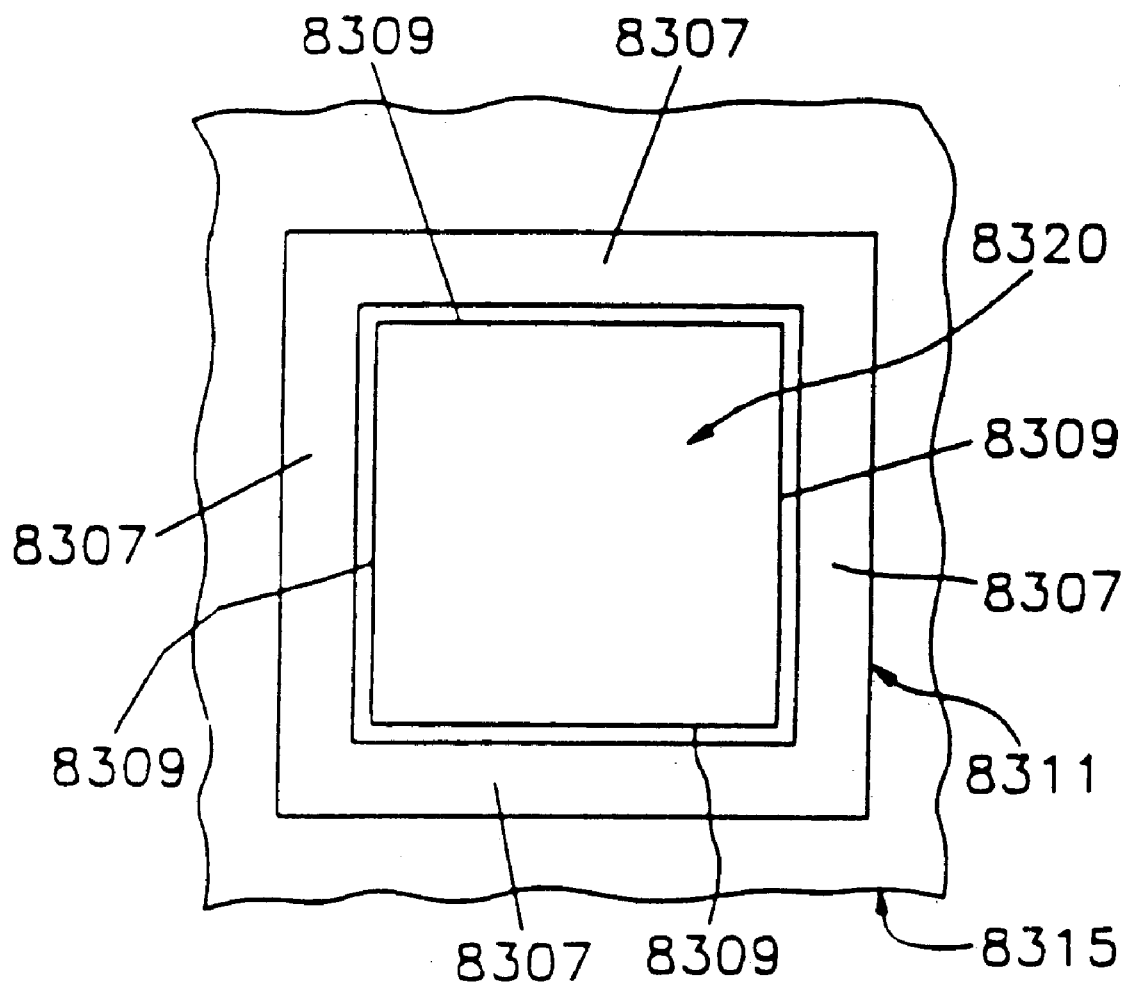

FIG. 19 is a fragmentary plan view depicting certain components used in the assembly according to FIGS. 16 and 17.

Figure 20:
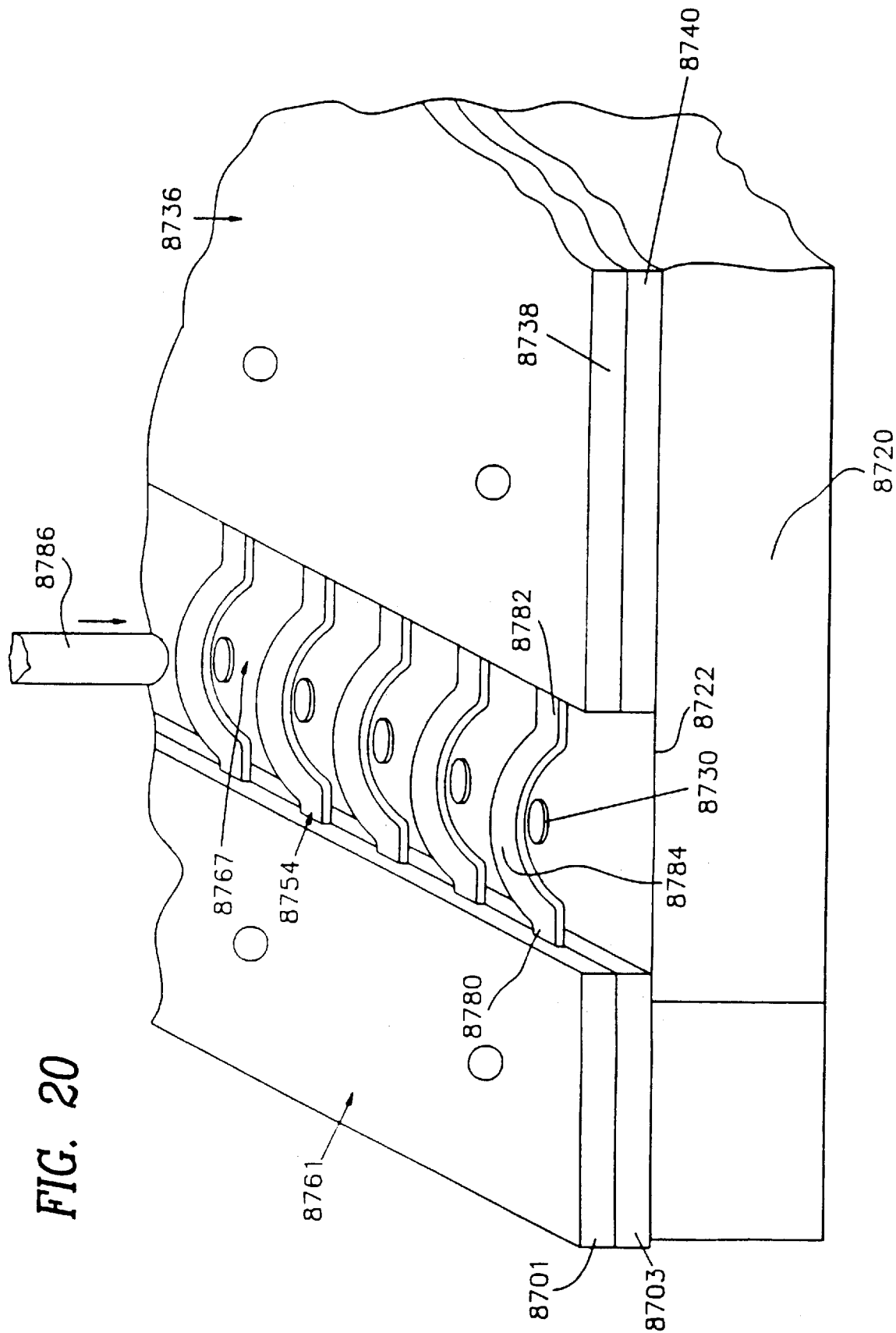

FIG. 20 is a fragmentary perspective view similar to FIG. 16 but depicting portions of any assembly in accordance with a further embodiment of the invention.

Figure 21:
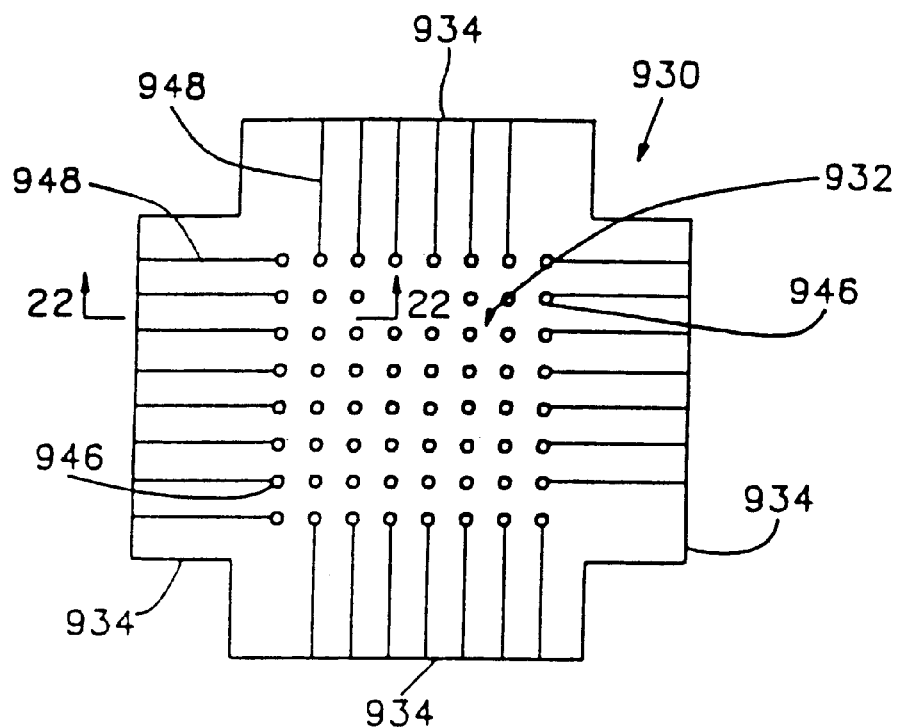

FIG. 21 is a diagrammatic plan view of a component.

Figure 22:
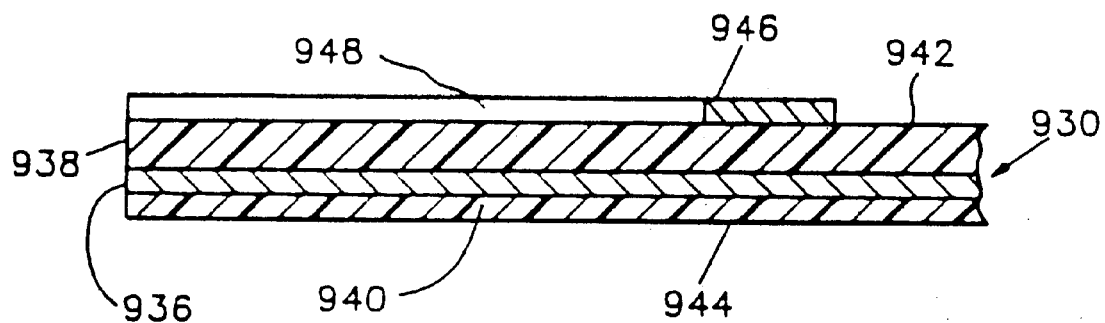

FIG. 22 is a fragmentary sectional view on an enlarged scale taken along lines 22–23 in FIG. 21.

Figure 23:
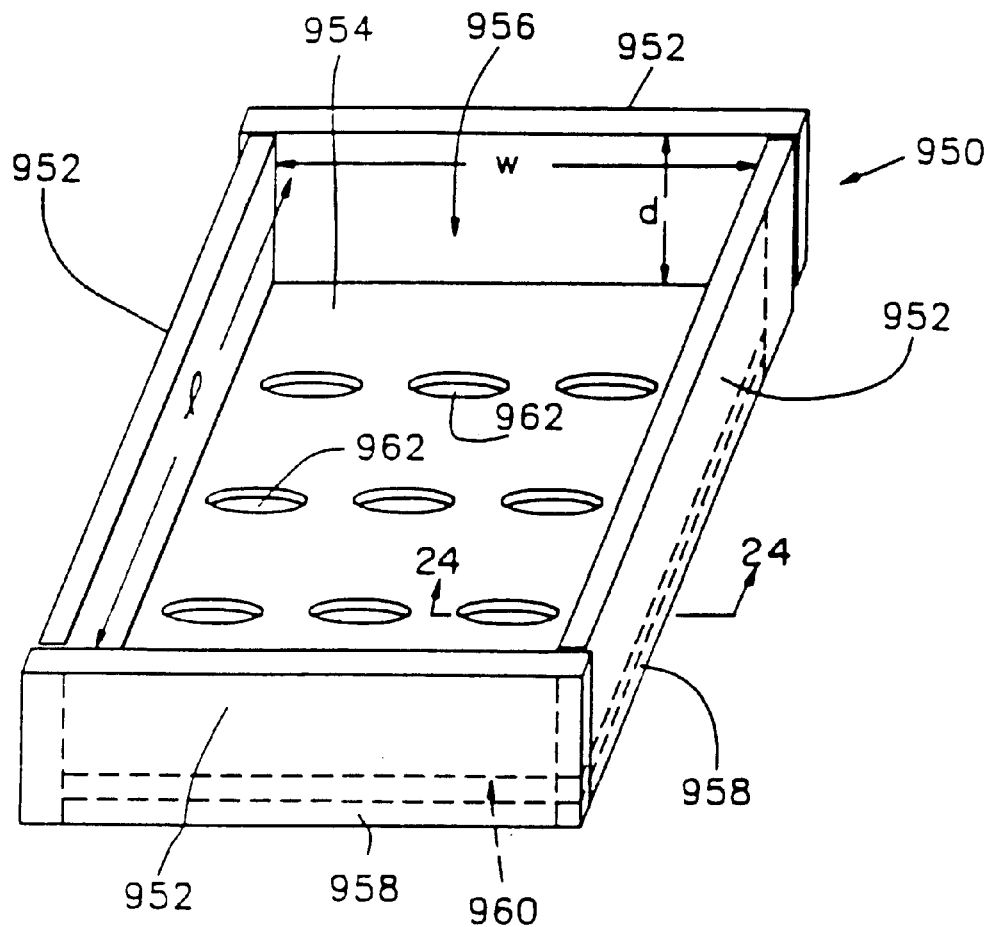

FIG. 23 is a diagrammatic perspective view of a further component used with the components of FIGS. 21–22.

Figure 24:
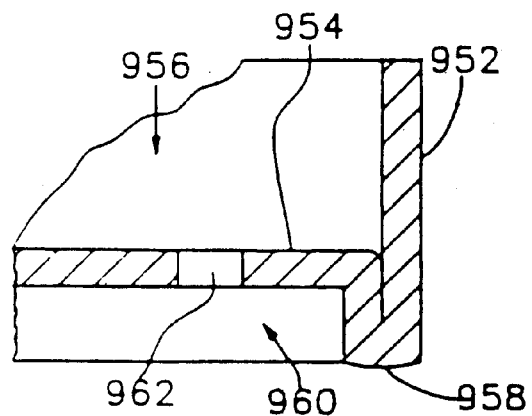

FIG. 24 is a fragmentary sectional view taken along lines 24—24 in FIG. 23.

Figure 25:
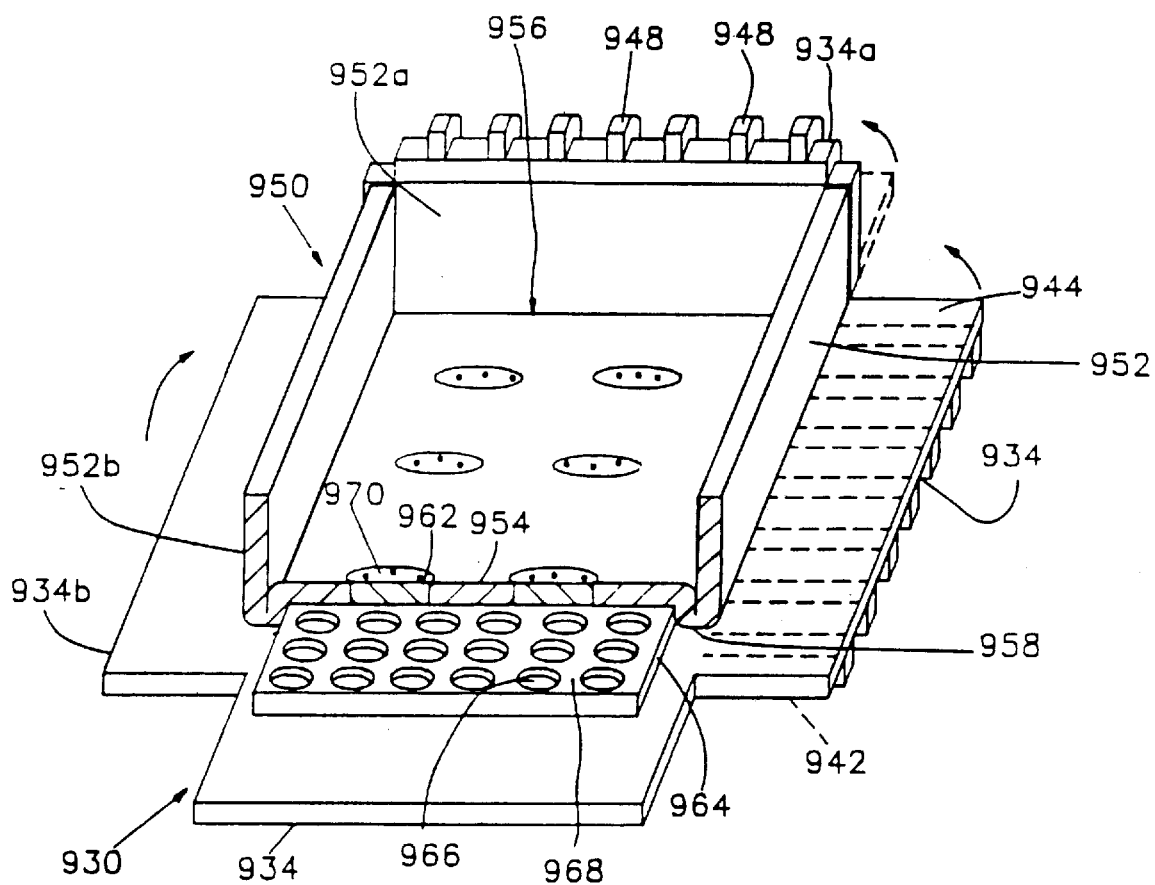

FIG. 25 is a diagrammatic perspective view showing the components of FIGS. 21–24 at an intermediate stage of an assembly process.

Figure 26:
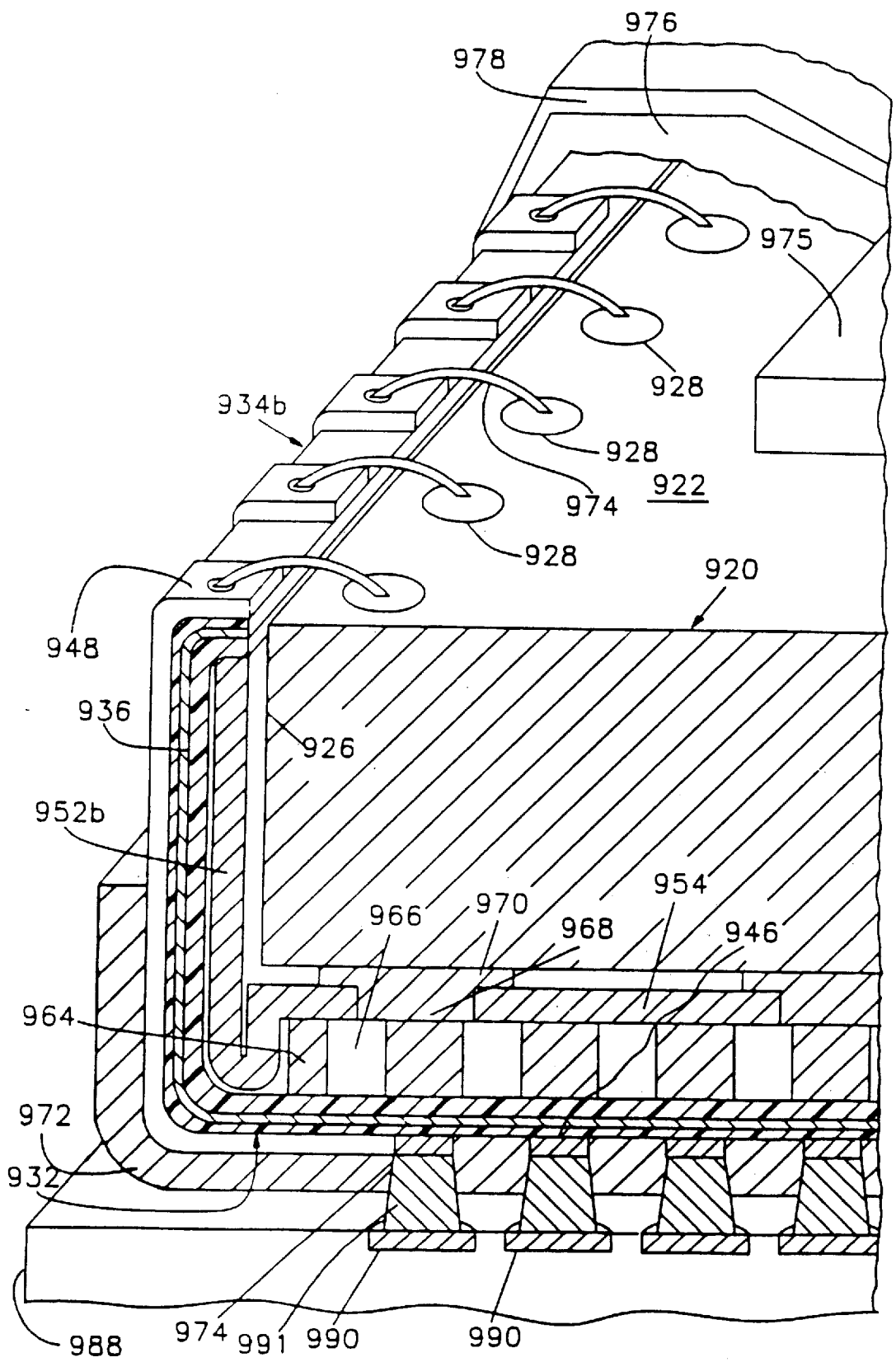

FIG. 26 is a fragmentary, partially sectional perspective view depicting a final assembly incorporating the components of FIGS. 21–25.

Figure 28:
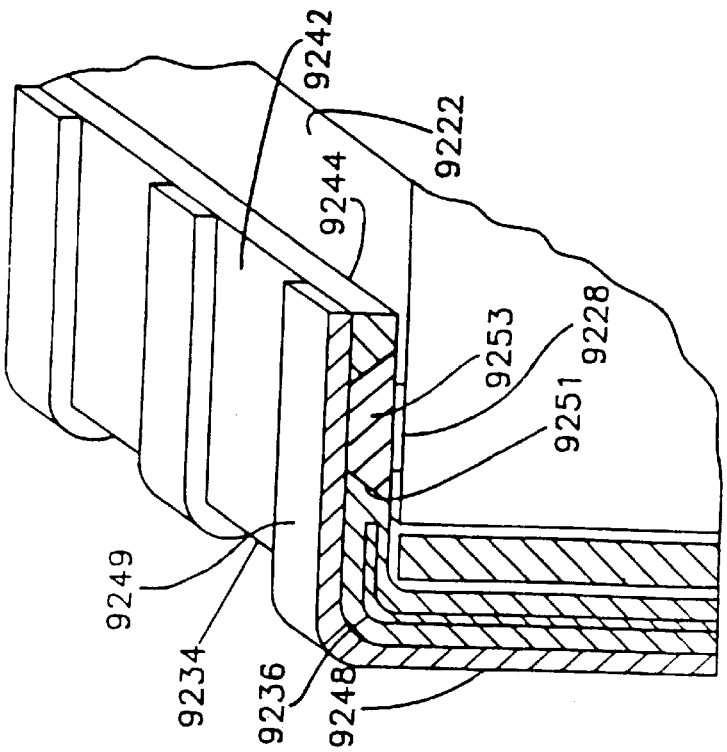
Figure 27:
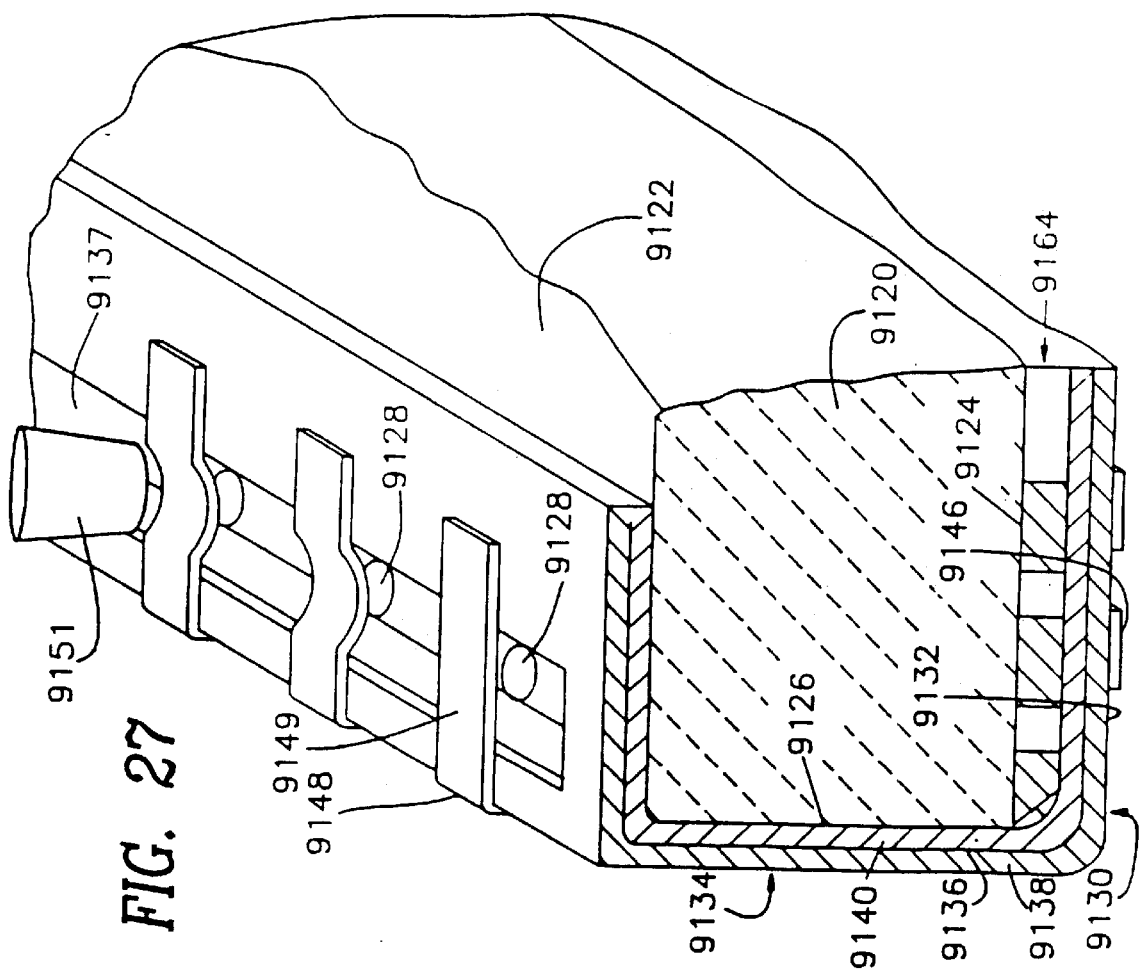

FIGS. 27 and 28 are fragmentary, partially sectional perspective views depicting components in accordance with additional embodiments of the invention.

Figure 29:
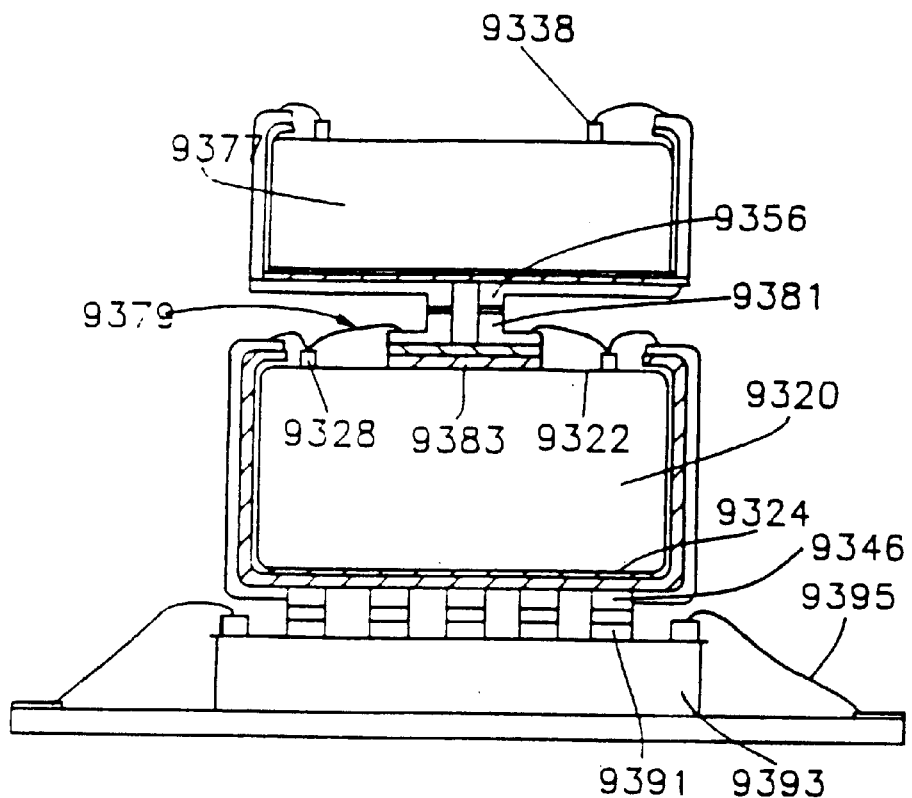
Figure 30:
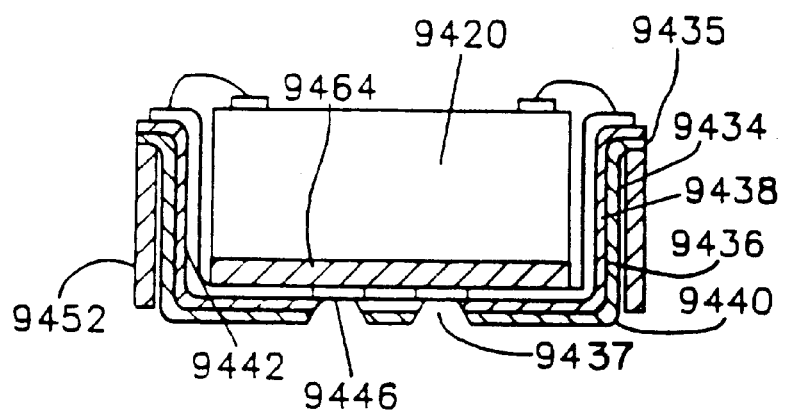

FIGS. 29 and 30 are diagrammatic sectional views depicting still further embodiments.

DETAILED DESCRIPTION OF THE PREFERRED EMBODIMENTS

Each chip assembly in accordance with one embodiment of the present invention includes a rigid substrate 20 having a top surface 22 and having contact pads 24 disposed on the top surface. Substrate 20 is also provided with conductors 26 interconnecting certain ones of the contact pads 24. The contact pads 24 are arranged in a pattern on the top surface of the substrate generally corresponding to the pattern of connections to devices, such as semiconductor chips 28 and 30 and discrete components 32 mounted on the substrate. Substrate 20 also has external connections such as pins 34. The conductors 26 are arranged to interconnect the various contact pads 24 in the desired patterns so as to interconnect chips 28 and 30 when the same are mounted to the substrate and also to connect these chips to the discrete components 32 and to the external connectors 34 in the appropriate manner for functioning of the particular circuit. Although only a few contact pads 24, conductors 26 and external connections 34 are illustrated in FIG. 1, the substrate 20 may have an unlimited number of contact pads 24, conductors 26 and external connections 34. Hundreds or thousands of these elements typically are provided in each substrate.

Chip 28 has a generally planar rear face 36 and a generally planar front face 38 with electrical contacts 40 (FIG. 2) disposed thereon. The electrical contacts 40 are electrically connected to the internal electronic components (not shown) of chip 28. Chip 28 is mounted on substrate 20 in a front-face-down orientation, with the front face 38 of the chip facing toward the top of face 22 of the substrate. A flexible, sheetlike dielectric interposer 42 is disposed between the chip and the substrate. Interposer 42 has a first generally planar face 44 facing toward chip 28 and a second generally planar face 46 facing in the opposite direction, away from chip 28. Interposer 42 may incorporate one or more layers. Preferably, the interposer includes a compliant, compressible layer as further discussed below. Interposer 42 has a plurality of terminals 48 on its second face 46. Each such terminal is associated with one of the contacts 40 on chip 28 and connected to such contact by a flexible lead 50. Each terminal 48 is also associated with one contact pad 24 on substrate 20, and each terminal is bonded to the associated contact pad by a mass 52 of electrically conductive bonding material such as solder or a conductive polymer. Thus, the contacts on chip 40 are interconnected, via leads 50, terminals 48 and masses 52 with the contact pads 24 on the substrate.

Figure 2:
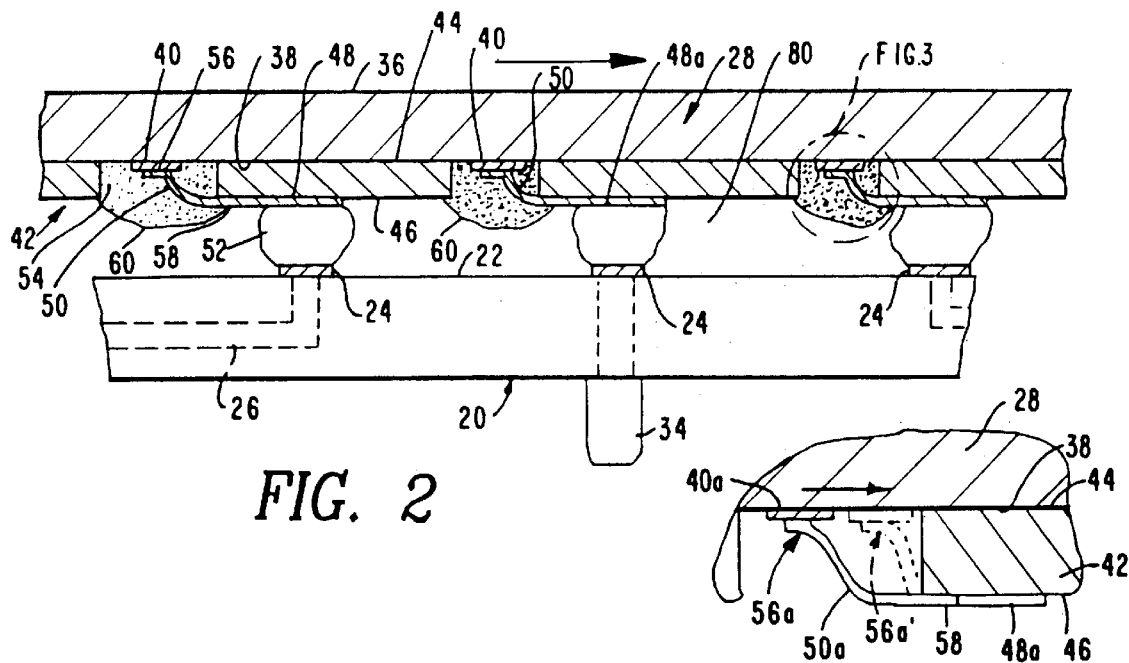
FIG. 2 is a fragmentary sectional view taken along line 2—2 in FIG. 1.

Interposer 42 has apertures 54 extending through it, from its first surface 44 to its second face of 46. Each aperture is aligned with one contact 40 on chip 28. Each terminal 48 is disposed adjacent one of the apertures 54. The lead 50 associated with each terminal has a contact end 56 disposed within the associated aperture 54 and connected to the associated contact 40 on the chip. Each lead 50 also has a terminal end 58 connected to the associated terminal 48. In the structure of FIG. 2, the leads 50 are formed integrally with the terminals 48 so that the terminal end 58 of each lead merges with the associated terminal 48. As best seen in FIG. 2, each lead 50 is curved between its contact end 56 and its terminal end 58. The curvature is in the direction perpendicular to the faces 46 and 48 of the interposer. An elastomeric, dielectric encapsulant 60 is disposed in apertures 54 so that the encapsulant covers the contact ends 56 of leads 50 and hence covers the junctures of the leads with the contacts 40.

Figure 3:
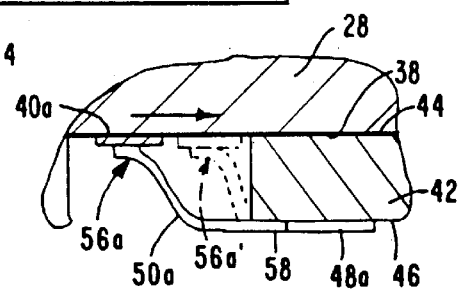
FIG. 3 is a fragmentary view, on an enlarged scale, of the area indicated in FIG. 2.

The contact end 56 of each lead 50 is moveable relative to the associated terminal 48. As best seen in FIG. 3, the contact end 56a of lead 50a can be displaced from its normal, undeformed position (shown in solid lines) in the directions parallel to the faces 44 and 46 of interposer 42 and parallel to the front face 38 of chip 28. For example, the contact end 56a may be displaced to the position indicated in broken lines at 56a'. This displacement is permitted by the flexibility of the lead 50 and by buckling and wrinkling of interposer 42. Encapsulant 60 is compliant, and does not substantially resist flexing of leads 50 and buckling and wrinkling of interposer 42. The displacement illustrated in FIG. 3, from the normal undisplaced position 56a to the displaced position 56a' places the lead 50 in compression. That is, the terminal end 56a moves generally toward the associated terminal 48 in moving from position 56a to position 56a'. Movement in this direction is particularly well accommodated by buckling of the lead 50. The contact end of each lead can also move in other directions, such as in the opposite direction from position 56a away from the associated terminal 48, and in directions perpendicular to these directions, into and out of the plane of the drawing as seen in FIG. 3. Prefabricated leads formed on the interposer may curved in directions parallel to the face of the interposer and parallel to the plane of the front face of the chip. This provides increased flexibility in the leads. Desirably, the curved portion of each lead overlies an aperture in the interposer. Thus, the curved portion of the lead is not bonded to the interposer. This portion of the lead therefore can flex to accommodate relative movement of the contact and terminal without deformation of the interposer.

Figure 4:
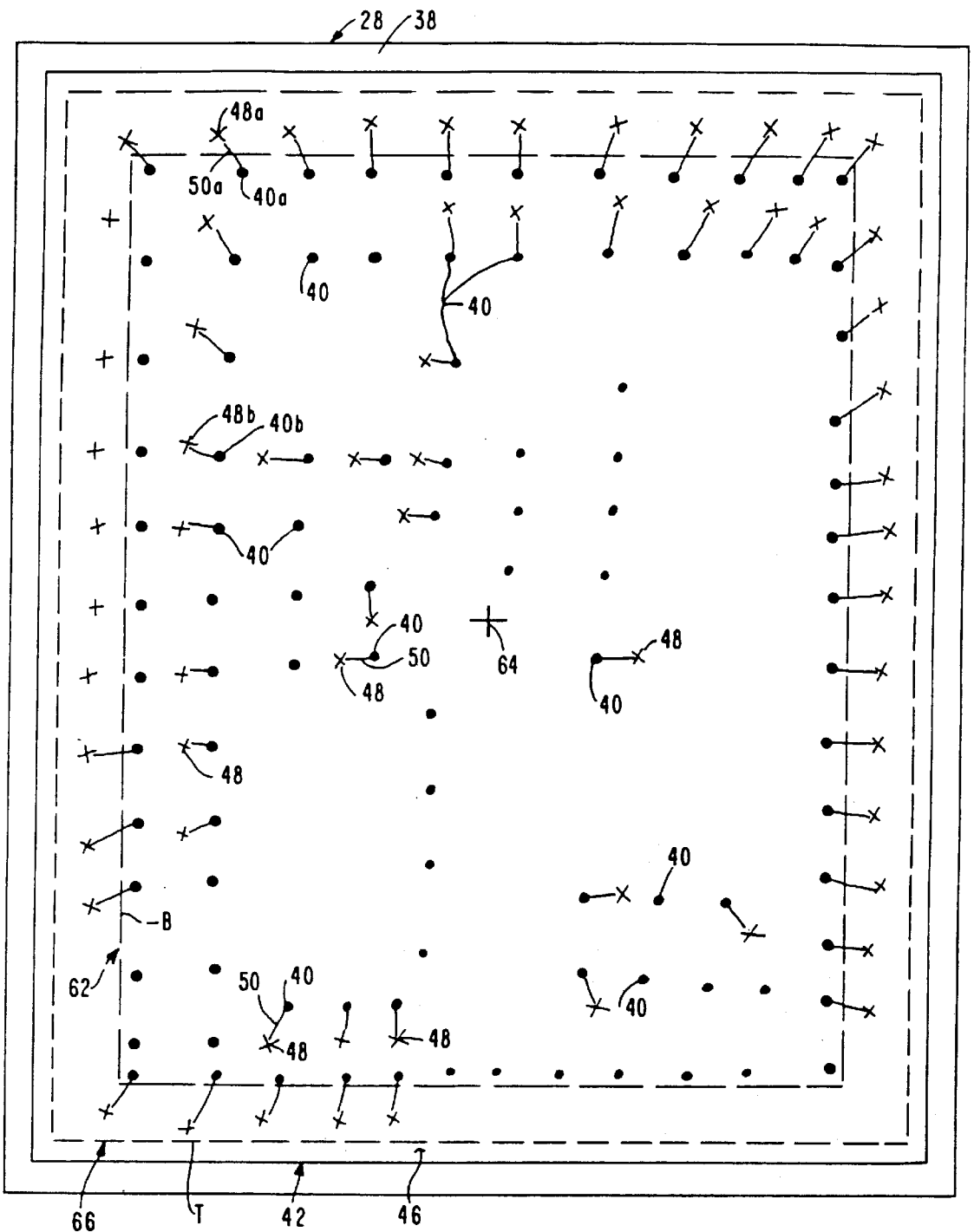
FIG. 4 is a layout diagram depicting the spatial relationship of certain components in the assembly of FIG. 1.

As best seen in FIG. 4, the contacts 40 on chip 28 (each symbolized by a dot in FIG. 4) are disposed in a pattern on the front surface of chip 28. Contacts 40 cooperatively encompass a contact pattern area 62 on the front face of chip 28. The boundary of the contact pattern area is illustrated by a broken line B in FIG. 4. The boundary of the contact pattern area may be taken as the shortest combination of imaginary line segments along the front face of the chip which cooperatively enclose all of the contacts 40. In the particular example illustrated in FIG. 4, this boundary is generally in the form of a rectangle. Contacts 40 are disposed throughout contact pattern area 62, in locations determined by the interior structure of chip 28. Contact pattern area 62 includes a peripheral region, adjacent the boundary B, and a central region, adjacent the geometric center 64 of the contact pattern area. Contacts 40 are disposed both in the peripheral region and in the central region. Typically, although not necessarily, the contacts 40 are disposed at substantially equal spacings throughout the entirety of contact pattern area 62. The terminals 48, each symbolized by an X in FIG. 4, are disposed in a similar pattern on the second surface 46 of interposer 42. At least some of terminals 40 are disposed in the area of interposer surface 46 overlying contact pattern area 62. Terminals 64 encompass a terminal pattern area 66 on the second face 46 of the interposer. The boundary of terminal pattern area 66 is illustrated in FIG. 4 by the broken line T. The boundary of the terminal pattern area may be taken as the shortest combination of imaginary line segments which would cooperatively enclose all of the terminals on the second surface of the interposer. The geometric center of terminal array area 66 desirably is coincident, or approximately coincident, with the geometric center 64 of the contact array area. Desirably, terminal pattern area 66 is not substantially larger than contact pattern area 62. That is, the perimeter of the terminal area preferably is less than about 1.2 times, and most preferably about 1.0 times the perimeter of contact pattern area 62. Stated another way, the outermost terminals 48 desirably lie within or close to the boundary B of contact array area 62. The total area encompassed within terminal pattern area 66 desirably is less than about 1.4 times, and most desirably about 1.0 times the total area encompassed within contact pattern area 62. Thus the leads 50 connecting contacts 48 to terminals 40 do not "fan out", away from the geometric center 64 the contact pattern area. Typically, the mean distance of the terminals 48 from geometric center 64 of the contact pattern area, measured in the direction parallel to the surfaces of the chip and interposer, is less than about 1.1, and typically about 1.0, times the mean distance of the chip contacts 40 from center 64.

Figures 5A, 5B:
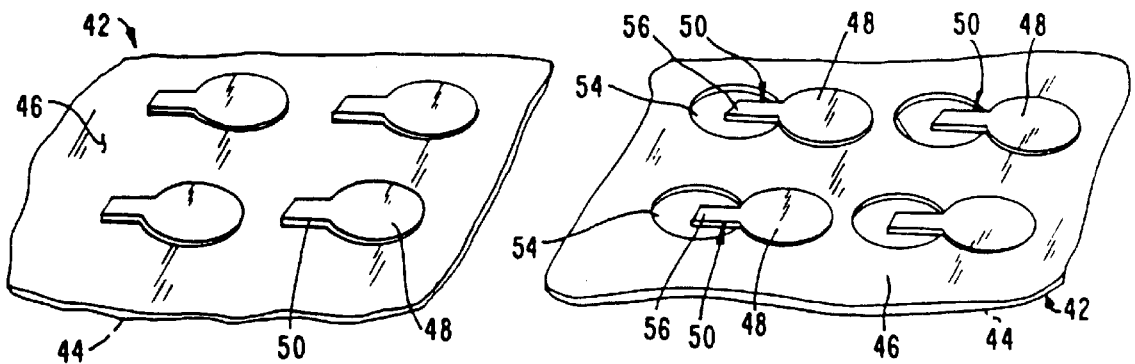
FIGS. 5A and 5B are fragmentary diagrammatic perspective views depicting certain operations, in manufacture of a component utilized in the assembly of FIG. 1.

The interposer and leads utilized in the structure of FIGS. 1–4 may be fabricated by a process as schematically illustrated in FIGS. 5A–5B. In this procedure, the terminals 48 and leads 50 may be deposited on the second surface 46 of the sheetlike interposer by conventional printed circuit manufacturing techniques before formation of apertures 54. Thus, the leads and terminals may be formed either by an additive process, wherein the metal is deposited in the desired pattern by plating, or else in a subtractive process which begins with a laminate including both the sheetlike interposer 42 and a full layer of metal and removes the metal except in the areas where the terminals and leads are desired, so as to yield a sheet having the terminals and leads in position (FIG. 5A). After formation of the terminals and leads, apertures 54 are formed in registration with the contact ends 56 of the leads 50 (FIG. 5B) by etching through the interposer from the first surface 44, or by applying radiant energy such as laser beam focused at the appropriate spots on the first surface 44.

Figure 10A:
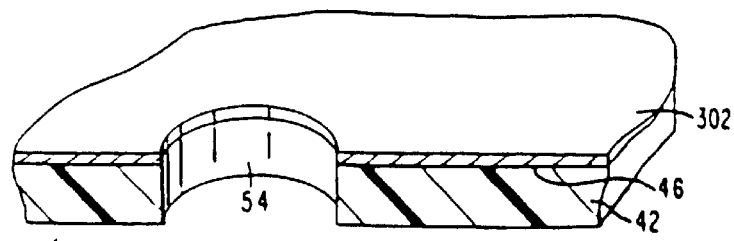
Figure 10B:
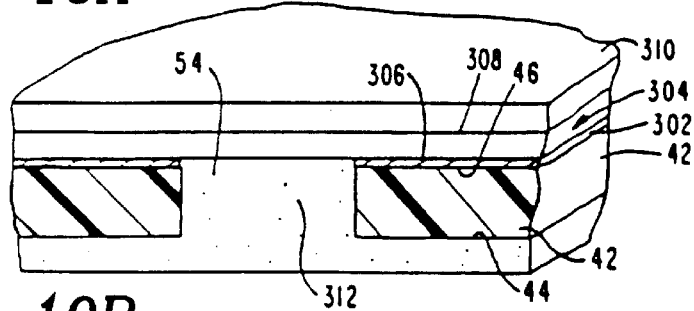

A further method of making a component incorporating the interposer, terminals and leads is shown in FIGS. 10A–10E. In this method, the apertures 54 are formed in interposer 42, and the aperture interposer is provided with a layer 302 of adhesive on the second surface 46 of the interposer. A conductive sheet, such as a sheet of copper 304 is applied on the first surface of the interposer, so that sheet 304 overlies adhesive 302 and so that sheet 304 overlies the apertures 54. A first surface 306 of sheet 304 faces towards interposer 42 and confronts the second surface 46 of the interposer, with the adhesive layer 302 disposed there between. A second surface 308 of the conductive sheet faces away from the interposer. A layer 310 of a photosensitive resist composition is applied on the second surface 308 of conductive layer 304. A second resist composition 312 is placed within apertures 54 so that resist 312 covers the first surface 306 of conductive layer 304 within apertures 54. Desirably, resist 312 is applied by applying a layer of the second resist composition to the first surface 44 of interposer 42 as illustrated in FIG. 10B. Both resist compositions 310 and 312 may be provided as so-called "dry resists" i.e., as a film of resist composition which can be laminated to the other structures. Resist composition 312 is laminated to the first surface 44 of the interposer 42 under pressure so that the resist composition flows into apertures 54 and substantially fills these apertures.

Figure 10C:
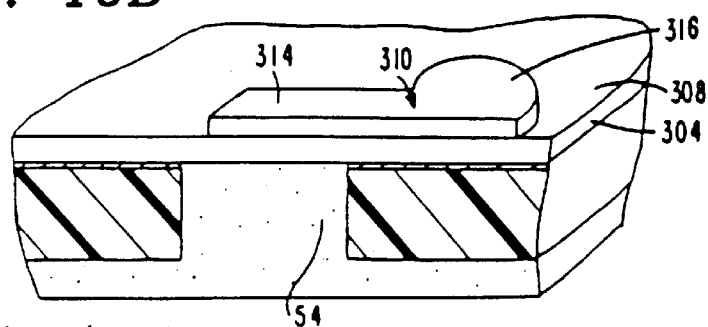

In the next stage of the process, depicted in FIG. 10C, the first resist layer 310 is selectively cured and uncured portions are removed so as to leave the cured resist in a pattern corresponding to the desired pattern of conductive materials in the finished product. Such selective curing and removal of a resist layer may be accomplished by known photographic techniques. The remaining resist pattern an the second surface 308 of the conductive layer 304 includes elongated lead areas 314 and terminal areas 316 contiguous with the lead areas. At least a part of each lead area 314 overlies one of the apertures 54 in the interposer, whereas the terminal areas 316 do not overly the apertures. The portion of each lead area 314 overlying an aperture is smaller than the aperture, so that each lead area overlies only a portion of the associated aperture 54. Desirably, each lead area 54 protrudes lengthwise across the aperture 54, as illustrated in FIG. 10C. The second resist material 312 within apertures 54 desirably also is cured. As the second resist material may be cured in its entirety, and need not be cured selectively in a predetermined pattern, the second resist material may be of a type which can be cured by exposure to heat or other nonselective curing method. Alternatively, the second resist material 312 may be photographically cured.

Figure 10D:
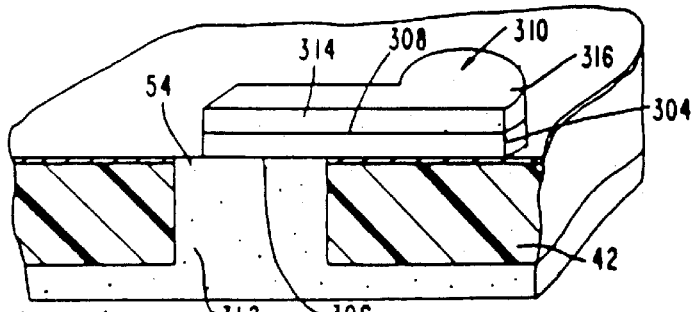
Figure 10E:
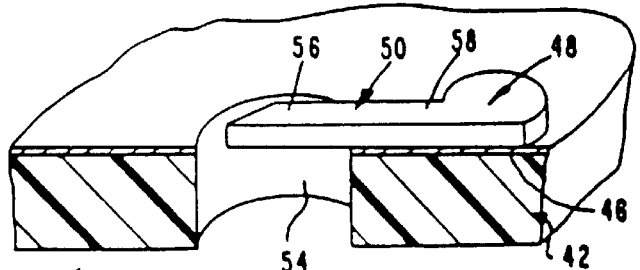

In the next stage of the process, illustrated in FIG. 10D, the assembly is immersed in an etchant capable of dissolving the conductive material in layer 304 so that the etchant contacts this layer. During the etching procedure, the first resist in lead area 314 and terminal areas 316 protects the second surface 308 of conductive layer 304. The interposer 42 protects the first surface 306 of layer 304 in the terminal areas 316 and in those portions of lead areas 314 which do not overly apertures 54. The second resist 312 protects the first surface 306 in those portions of lead areas 314 which overlie apertures 54. The etchant therefore does not attack those portions of conductive layer 304 covered by lead portions 314 and terminal portions 316 of the first resist layer 310. The first resist layer 310 and the second resist 312 are then removed by conventional resist decomposition processes such as exposure to solvents which attack the resist. This leaves the unattacked portions of conductive layer 304 as lead 50 and terminals 48 on the second surface 46 of interposer 42, with a contact end 56 of each lead 50 protruding over the associated aperture 54 and with a terminal end 58 of each lead connected to the associated terminal 48.

This process can be modified. For example, the adhesive layer 302 may be omitted where the conductive layer forms a satisfactory bond to the material of the interposer. Also, the pattern first resist 310 need not be provided by a subtractive process as discussed above but instead may be provided by an additive process, wherein the resist is applied only in the areas to form the pattern, as by silkscreening. Formation of the leads So and terminal 48 by this type of etching process is particularly useful in forming fine leads in good registration with apertures 54. Also, as the apertures 54 are preformed, there is no possibility of damaging the leads during formation of the apertures.

The assembly of the interposer and terminals and contacts is fabricated in a substantially continuous sheet or strip. As illustrated in FIG. 6, the interposers may be provided in the form of a continuous tape 70, with plural interposers 42 spaced lengthwise along the tape, each such interposer having terminals 48 and leads 50 thereon. Tape 70 may be in the form of a single sheet of the material employed for the interposers 42, or else may include separate pieces of such material, each constituting one or more interposers, secured to a backing or the like. Tape 70 may have sprocket holes (not shown) or other features such as those commonly utilized on the tapes for tape automated bonding of semiconductor chips.

In an assembly method according to the invention, tape 70 is advanced in a downstream direction (to the right as seen in FIG. 6) and chips 28 are connected to the tape upon assembly of each chip with one interposer 42 and with the associated terminals and leads. The chips are subsequently carried downstream with the tape, through further operations as discussed below.

As best seen in FIG. 7, each interposer, with the terminals 48 and leads 50 thereon, is brought into juxtaposition with a chip 28, and the chip is aligned with the interposer so that each aperture 54 is aligned with one contact 40 of the chip. The interposer 42 and chip 28 are brought together, so that the first face 44 of the interposer bears on the front face 38 of the chip, and the contacts are received in the apertures 54 of the interposer. The contact end 56 of each lead 50 initially lies substantially in the plane of the second surface 46 of the interposer. A tool 74 is advanced into engagement with the contact end 56 of each lead so as to deform the contact end 56 downwardly, into the underlying aperture 54 and towards the associated contact 40. Tool 74 may be a substantially conventional thermal bonding tool, thermosonic bonding tool, ultrasonic bonding tool, compression bonding tool, or the like of the types commonly used in tape automated bonding or wire bonding. By advancing the tool 74 into each aperture 54, the contact ends of leads are manipulated within the apertures and bonded to the contacts 40 on the chip. Although only a single tool 74 is depicted in FIG. 7, the bonding operation may be performed in a multiple operation, with many or all of the leads 50 being bonded to the associated contacts at once.

After the contacts and leads have been bonded to one another, the interposer and the chip are advanced to a further station, where the encapsulant 60 is applied within each aperture 54. The encapsulant 60 may be applied dropwise, by conventional drop application equipment. As best seen in FIG. 8, each drop of encapsulant 60 covers the contact end 56 of the associated lead, but leaves the associated contact 48 uncovered. The encapsulant protects the relatively delicate contact ends 56 of the leads and the relatively delicate junctures with the terminals 40. Once the encapsulant has been applied, the assembly of the interposer, leads, terminals and chips is advanced to a testing station. As illustrated in FIG. 8, the assembly, including the chip 28, may be tested. The test may involve connection of the chip, through the terminals 48, to an external electronic test device (not shown). The test device may be arranged to operate the chip under power for an appreciable period so as to "burn-in" the chip and detect any latent defects. Typically, numerous connections should be established to the chip simultaneously. As illustrated in FIG. 8, this may be accomplished by applying probes 76 to terminals 48. Probes 76 may be so called "noncompliant" probes. That is, probes may be arranged to move in unison, in the directions towards and away from the chip 28 (upwardly and downwardly as seen in FIG. 8). The probes 76 are mounted to a common fixture (not shown) so that the vertical position of the probes relative to one another are fixed. This type of "noncompliant" probe array is particularly convenient where the required spacings between probes (the spacings of the terminals 48) are relatively small. However, non-uniformities in the dimensions of the probes 76 and/or in the dimensions of the terminals 48 or chip 28 may cause one or more of the probes 76 to engage the associated terminal 48 before the other probes have engaged their terminals. Desirably, interposer 42 is compliant, so that each terminal 48 can be displaced slightly by the associated probe 76 in the direction toward chip 28. The region of interposer 42 beneath each terminal 48 compresses slightly to accommodate such displacement. This allows all of the probes 76 to engage their associated contacts 48 without imposing excessive loading on any one probe. The terminals 48 may be larger than the contacts on the chip, so as to provide a relatively large area for engagement by each contact 76 and thus accommodate a reasonable amount of misalignment of the contacts in the directions parallel to the faces of the interposer. Because each chip can be tested in this fashion, prior to assembly with the substrate, defects in the chips, in the terminals and leads associated with the interposer and in the bonds between the leads and the chip contacts can be detected before the chip is united with the substrate.

After the testing operation, the chip and interposer are united with the substrate. The chip and interposer assembly is oriented so that the second face of the interposer, and the terminals 48, face the top surface of the substrate, and each terminal 48 confronts one contact pad 24 on substrate. Masses of solder are applied between the confronting terminals 48 and contact pads 24 and melted in a "solder reflow" operation so that the solder forms a solid joint between the contact pad and terminal, and so that the solder masses support the chip and interposer assembly above the substrate 20, in the orientation illustrated in FIG. 2. The solder application and reflow operation may be performed in substantially the same way as the solder application and reflow operation of conventional flip-chip bonding. Thus, the masses of solder may initially be applied to the contact pads 24 of the substrate, before the chip and interposer assembly is united with the substrate. Alternatively, the solder may be applied to the terminals 48 and bonded to the contact pads 24 in the reflow operation. A flux typically is employed in the solder reflow operation. Because the solder masses support the chip and interposer surface assembly above the substrate, there is a gap 80 between the interposer and the substrate. Flux residues may be rinsed out of the assembly by passing a rinsing fluid through this gap.

In an assembly method according to a further embodiment of the invention, the interposer 42 is not provided with leads before the interposer is united with the chip 28. Instead, leads 50' are applied by bonding separately formed pieces of fine wire to the terminals 48 and to the contacts 40 after the interposer is assembled with the chip. Leads 50' are flexible and curved, and arranged to deform as discussed above so that each contact 40, and the associated contact end of the lead 50' can move relative to the associated terminal 48 so as to accommodate thermal expansion. In the embodiment illustrated in FIG. 9, a layer of an adhesive 81 is disposed between the first surface of the interposer and the front surface of the chip.

The subassembly illustrated in FIG. 9 may be further provided with an encapsulant (not shown) in the form of a layer covering substantially the entire second face 46 of interposer 42 and hence filling the apertures 54 and covering the leads 50'. The layer is provided with holes in alignment with the terminals 48. These holes may be formed by etching the encapsulant layer by applying this layer in a selective coating process such as silk screening or the like or by applying the encapsulant layer in a selective curing process. Thus, the encapsulant which may be curable by ultraviolet or other radiant energy. The encapsulant may be deposited over the entire interposer, and over terminals 48. After application of the encapsulant, radiant energy may be applied selectively, so that the areas of the layer overlying terminals 48 remain uncured. These layers are then removed by washing or by a relatively mild etching operation, leaving holes in alignment with terminals 48. Alternatively, the encapsulant layer may be cured non-selectively and then portions may be removed by applying radiant energy such as laser light in alignment with terminals 48. Masses of electrically conductive bonding material are deposited within these holes in the encapsulant layer. These masses are then engaged with the contact pads (not shown) of the substrate and heated so that bonding material forms a bond between each terminal 48 and the associated contact pad on the substrate, in a manner similar to the solder bonds of the assembly depicted in FIG. 2.

A chip may have contacts disposed in a peripheral arrangement, i.e., where all of the contacts are disposed adjacent the periphery of the chip and hence adjacent the periphery of the contact pattern area. The central zone of the contact pattern area, adjacent the geometric center of the contact array, may be devoid of contacts. With such a chip, the terminals on the interposer may be arranged in a "fan in" pattern, i.e., where the mean distance from the geometric center of the contact array to the terminals on the interposer is less than the mean distance from this geometric center to the contacts on the chip. Some of the terminals are disposed on the area of the interposer overlying the central, contact-free zone of the contact pattern area. This arrangement can provide a substantially uniform distribution of terminals over an area equal to the contact pattern area. This provides a spacing between adjacent terminals larger than the spacing between adjacent contacts. Such an arrangement allows connection of chips with peripheral contact arrays to area arrays of contact pads on the substrate. Thus chips originally intended for conventional bonding processes such as tape automated bonding can be adapted readily and economically to substrates having compact contact pad arrays similar to those used in flip-chip bonding.

Chips may be provided in the form of a wafer incorporating a plurality of chips, all of the same design or of differing designs. Individual, separate, interposers may be positioned on the individual chips constituting wafer and the interposers may be assembled to the chips as discussed above. In this operation, the contacts on each chip are secured to the leads and terminals of each interposer. After the interposers are secured to the chips, and desirably after the junctures between the leads of each interposer and the contacts of each chip are encapsulated, the individual chips are separated from the wafer and from one another, as by cutting the wafer using conventional wafer severing or "dicing" equipment commonly utilized to sever individual chips without interposers. This procedure yields a plurality of chip and interposer subassemblies, each of which may be secured to an individual substrate.

Alternatively, a wafer incorporating a plurality of chips may be assembled to a sheet incorporating a plurality of interposers. Again, the contacts on each chip are secured to the terminals and leads of one individual interposer overlying the particular chip. The wafer and the sheet are severed after this operation, and desirably after encapsulating the leads, so as to provide individual subassemblies each including a chip and an interposer.

Interposer also may be provided in the form of a sheet incorporating plural interposers such as interposer and at predetermined relative positions corresponding to the positions of chips on a completed assembly including a substrate. Chips may be secured to the individual interposers and the entire assembly of plural chips and the sheet of plural interposers may be secured to a substrate. Each interposer in such an assembly desirably incorporates a pattern of terminals and leads as discussed above. This variant of the assembly procedures provides for consolidation of plural chips into a larger subassembly before bonding to the substrate.

A semiconductor chip 820 used in a further embodiment of the invention has a generally planar front face 822 (the face visible in FIG. 11) having a central region 824 adjacent the geometric center of the face and a peripheral region 826 adjacent the edges 828 bounding face 822. The front or contact-bearing face 822 of the chip is regarded as defining the top of the chip. Thus, in specifying directions, the direction pointing out of front face 822, and away from the chip, i.e., the direction pointing out of the plane of the drawing towards the viewer in FIG. 11, is the upwardly direction. The downward direction is the opposite direction. As used in the present disclosure with respect to a semiconductor chip assembly, such terms should be understood as based on this convention, and should not be understood as implying any particular directions with respect to the ordinary gravitational frame of reference. The chip 820 also has a plurality of peripheral contacts 830 arranged in rows 832, there being one such row adjacent each edge 828 of the chip. The rows 832 do not intersect one another but instead terminate at appreciable distances from the corners of the chip so that the corners 834 are devoid of peripheral contacts 830. The central region 824 of the chip front surface 822 is also devoid of contacts. The contacts 830 in each row 832 are spaced at very close intervals, typically about 100 to about 250 micrometers center to center. This center to center spacing is adequate for wire bonding or tape automated bonding. This chip configuration is typical of high I/O count chips originally intended for use with wire bonding or tape automated bonding systems.

In an assembly method according to one embodiment of the invention, a sheet-like dielectric interposer 836 is assembled to chip 820. Interposer 836 includes a flexible top layer 838 (FIG. 13) formed by a thin sheet of material having a relatively high elastic modulus and a compliant bottom layer 840 formed from a material having a relatively low elastic modulus. The high-modulus material of top layer 838 may be a polymer such as a polyimide or other thermoset polymer, a fluoropolymer or a thermoplastic polymer. The compliant, low-modulus material of bottom layer 840 may be an elastomer. Desirably, the low-modulus material has elastic properties (including modulus of elasticity) comparable to those of soft rubber, about 20 to 70 Shore A durometer hardness. Interposer 836 has a first or bottom surface 842 defined by bottom layer 840 and a second or top surface 844 defined by top layer 838. Bottom, compliant layer 840 includes holes or voids 841 interspersed with masses 843 of the low-modulus material.

Interposer 836 has edges 846 bounding surfaces 842 and 844 and extending therebetween. The interposer also has a plurality of central terminals 848 distributed over the second or top surface 844. Terminals 848 are disposed at substantially even spaces on surface 844 so that terminals 848 constitute a "area array". The dimensions of interposer 836 in the plane of top surface 844 are smaller than the corresponding dimensions of chip 820 in the plane of front surface 822. The number of central terminals 848 may be approximately equal to the number of peripheral contacts 830 on the semiconductor chip Nonetheless, the center-to-center linear distance between adjacent ones of central terminals 848 is substantially greater than the center-to-center distance between adjacent peripheral contacts 830 on the chip, because the central contacts 848 are substantially evenly distributed rather than concentrated in only a few rows. Each central terminal 848 is aligned with one of the masses 843 of low-modulus material in compliant layer 840, whereas the holes 841 in the complaint layer are out of alignment with the central terminals 848. In a variation of this embodiment, the holes may be aligned with terminals 848. In a further variation, the holes may be continuous with one another whereas the masses of low-modulus material may be separate posts or pillars entirely surrounded by such continuous holes.

As best seen in FIG. 13, each central terminal 848 is connected with a partial lead 50 and a bonding terminal 852 which are formed integrally with the central terminal. Central terminals 848, partial leads 50 and bonding terminals 852 may be formed from substantially any electrically conductive material, but preferably are formed from metallic material such as copper and copper alloys, noble metals and noble metal alloys. These components typically are fabricated on the top or second surface 844 of interposer 836 by conventional photolithographic end etching or deposition techniques. Bonding terminals 852 are arranged in rows 54 adjacent the edges 846 of the interposer. As best seen in FIG. 12, there are four such rows 54 of bonding terminals, one adjacent each edge of the interposer.

In the assembly method according to this embodiment of the invention, the interposer 836 with the preformed terminals 848, partial leads 50 and bonding terminals 852 thereon is positioned on chip 820 so that the first surface 842 of the interposer faces the front surface 822 of the chip, and so that the edges 846 of the interposer are disposed inwardly of the rows 832 of peripheral contacts 830 on the chip. Bonding terminals 852 are electrically connected to contacts 830 on the chip by a conventional wire bonding operation. The arrangement of the bonding terminals 852 in rows parallel to and adjacent to the rows of peripheral contacts 830 on the chip substantially facilitates the wire bonding process. The fine, flexible bonding wires 856 applied in the wire bonding operation merge with the bonding terminals 852 and partial leads 50 on the interposer to form composite leads extending from the peripheral contacts of the chip to the central terminals on the interposer. As best appreciated with reference to FIG. 13, each such composite lead extends inwardly from one peripheral contact 830 to an associated central terminal 848 in the central way. Each such composite lead extends across the edge 846 of the interposer.

In the next stage of the process, a low elastic modulus dielectric encapsulant or solder masking material such as a silicone rubber or other castable elastomer 858 (FIG. 14) is applied over the interposer and chip and over bonding wires 856. The encapsulant is applied so as to leave holes 860 in alignment with each of the central terminals 848 on the interposer. This may be accomplished as discussed above with reference to the assembly of FIG. 9. At this stage, the assembly is relatively rugged and can be handled readily. Thus, the wires 856 are fully protected by the encapsulant.

Either before or after the encapsulant 858 is applied, the chip and all of the connections made within the assembly can be tested by making temporary electrical connections to the central terminals 848. Because the central terminals 848 are at substantial center-to-center distances, they may be readily contacted with probes such as the plural probe set 862 schematically illustrated in FIG. 14. Moreover, because the bottom layer 840 of the interposer is compliant, each central terminal 848 is displaceable towards and away from the front surface 822 of the chip 820. Thus, the bottom layer can be compressed by the tips 864 of the probe set 862. This greatly facilitates making good electrical contact between a plurality of probes and a plurality of central terminals at once, and hence greatly facilitates electrical testing of the chip and the other components of the assembly. The configuration of compliant layer 840 contributes to this action. Each mass 843 of low-modulus material provides backing and support for the aligned terminal 848. As the tips 864 of the test probe set 862 engage the terminals, each mass 843 is compressed in the vertical direction and therefore tends to bulge in horizontal directions, parallel to the plane of the chip. Holes 841 provide space for such bulging. Each terminal 848 can move downwardly toward the chip substantially independently of the other terminals. Compliant layer 840 need only provide for sufficient downward movement of terminals 848 to accommodate tolerances in the components and test equipment by accomodating differences in vertical position between adjacent terminals and/or test probes. Typically, about 0.125 mm or less compliance is sufficient. For example, complaint layer 840 may be about 0.2 mm thick.

Although test probe set 862 is schematically illustrated as including only a few tips 864, the test probe set in fact may include a full complement of tips 864, equal in number to the number of terminals 848, so that all of terminals 848 can be engaged simultaneously. The tips of probe set 862 may be rigidly mounted to a common support 865. Therefore, the test probe set may be rugged, reliable and durable. The particular shape of tips 864 is not critical. However, tips 864 may desirably be formed as small metallic spheres solder-bonded to support 865. Support 865 in turn may be a ceramic body with appropriate internal leads, similar to a conventional semiconductor substrate. Because the test probe set may make simultaneous connections with all terminals in the subassembly, and because the test probe set may have dimensions and configuration similar to a real substrate, the temporary electrical connection made using the test probe can provide a realistic test of the chip and interposer subassembly. In particular, the test probe set need not involve long leads which may introduce unwanted inductance and/or capitance. Accordingly, the test probe set can be employed to test and operate the chip at full speed. Because the test probe set may be a simple, economical device, many such probe sets can be provided in a manufacturing plant, so that each chip can be tested for a prolonged period.

In the next stage of the assembly operation after testing, the chip and interposer subassembly is juxtaposed with a substrate having electrical contact pads thereon. The assembly is placed on the substrate so that the central terminals 848 face toward the electrical contact pads on the substrate, and so that each central terminal 848 is aligned with one contact pad. Masses of an electrically conductive bonding material such as a solder or an electrically conducted adhesive may be disposed between the central terminals and the contact pads of the substrate. These masses may then be caused to flow and to bond with the central terminals 848 and the contact pads thereby forming mechanical and electrical connections between the central terminals and the contact pads. This stage of the process may utilize essentially the same techniques as are employed in surface mount technology for assembly of components on printed circuit boards. Because the central terminals 848 are disposed at substantial center-to-center distances, the standard surface mount techniques can be used without difficulty. For example, a high I/O count can be achieved with 10–25 mil (250–625 micrometer) center-to-center distances. In an alternate embodiment, each contact pad on the substrate may be a microminiature separable connector such as a socket, and a mating separable connector may be provided on each terminal. For example, each terminal 848 may incorporate a miniature pin adapted to engage such a socket. In this case, the pins would serve as the means for connecting terminals 848 to the contact pads of the substrate. The encapsulent or solder mask layer can be provided with metal rings surrounding each hole 860 and hence surrounding each terminal 848. Each such ring defines a preselected area which can be wetted by solder and thus confines the solder of each joint to a preselected area. Also, small studs, balls, or pins may be positioned in the holes of the solder mask layer in electrical contact with the terminals 848, and these studs may be soldered to a substrate.

Inasmuch as each peripheral contact 830 on the chip is connected to one of the central terminals 848 on the interposer, and each such central terminal is connected to one of the contact pads on the substrate, each peripheral contact 830 is connected to one of the contact pads of the substrate. The substrate contact pad of course may be connected to other elements of an electrical circuit through conventional connections (not shown) incorporated in the substrate. For example, substrate may be a circuit board, circuit panel or hybrid circuit substrate incorporating various electronic elements in addition to chip 820.

The interconnections between the chip and the substrate (between peripheral contacts 830 and contact pads) are accommodated within the area of the chip itself, i.e., within the area on the substrate occupied by chip 820. Thus, no space on the surface of the substrate is wasted by a conventional "fan-out" pattern of interconnections. Moreover, the assembly is substantially resistant to thermal cycling. Each of the composite leads connecting one of the chip peripheral contacts and one of the central terminals 848 on the interposer is flexible. Thus, the partial leads 50 (FIG. 13) on the interposer surface itself preferably are flexible, and the fine bonding wires 856 are also flexible. The interposer itself, and particularly the top layer 838 and bottom compliant layer 840 may be flexible. Accordingly, there can be substantial movement of terminals 848 on the interposer relative to contacts 830 on the chip in directions parallel to the chip front surface. Such movement can be accommodated without applying substantial forces to the junctions between the leads and the chip contacts. During use of the assembly, differential thermal expansion of chip 820 and substrate may cause appreciable displacement of the contact pads on the substrate relative to peripheral contacts 830 on the chip. Inasmuch as the central terminals 848 of the interposer are bonded to the contact pads of the substrate by relatively stiff noncompliant conductive masses, the central terminals will tend to move with the contact pads. However, such movement is readily accommodated and does not result in substantial stresses at the bonds between the central terminals and contact pads.

The assembly shown in FIG. 15 has an interposer 836' similar to the interposer discussed above with reference to FIGS. 11–14. However, the prefabricated leads 850' associated with terminals 848' have outer or contact portions 854' projecting outwardly beyond the edge 846' of the interposer. As prefabricated leads 850' are disposed on top layer 838' of the interposer, the prefabricated leads cross the edge 846' of the interposer at an appreciable height above the first or bottom surface 842' of the interposer. The projecting outer portions 854' are curved downwardly, toward the first surface 842' of the interposer. This curvature desirably is provided during fabrication of the interposer and leads, before the interposer is assembled to the chip. In the assembly operation, the interposer 836', with the leads 850' and terminals 848' already mounted thereon is placed onto chip 820' so that the outer portions 854' are in alignment with contacts 830' of the chip. The curvature of the leads places the outer or contact portions 854' in close proximity to chip contacts 830' A tool 855 is then applied to the outer portions 854' so as to force the outer portions thus forcing leads 854' into engagement with the chip contacts 830' so as to bond the outer portions 854 of leads 850' directly to the chip contacts. Typically, pressure is applied through tool 855 along with heat and/or ultrasonic energy. This stage of the process may employ conventional thermolcompression or ultrasonic bonding techniques commonly used to bond inner leads in a tape automated bonding or "TAB" operation. This bonding establishes a connection between each chip contact 850' and one of the terminals 848' on the interposer, without the need for any intermediate wire bonding operation. Once the contacts and terminals are connected in this manner, the resulting subassembly can be encapsulated and bonded to a substrate in substantially the same fashion as discussed above. As leads 850' are flexible, terminals 848' are movable with respect to contacts 830' to compensate for thermal expansion.

The terminals 848' and leads 850' used in this structure can be fabricated by photolithigraphic techniques. For example, the interposer may initially be fabricated with a solid sheet of copper or other metal covering the second surface 844' and extending beyond edges 846'. These portions of the metal sheet extending beyond the edges of the interposer may be embossed to impact a downward curvature. The surface of the metallic layer facing upwardly away from the interposer (facing toward the top of the drawing in FIG. 15) may be covered with a conventional photoresist pattern such that the photoresist covers the areas corresponding to the terminals 848' and leads 850'. The opposite surface of the sheet may be covered with a further photo resist in the areas extending beyond the edges 846' of the interposer. The sheet may then be exposed to an etching solution so as to remove those areas not covered by the photo resist on the top surface, i.e., to remove all areas of the metal sheet other than the terminals 848' and leads 850'. The photo resist may be removed, leaving interposer with the terminals and leads thereon. The curvature imparted to the metal sheet by embossing provides the desired downward curvature in the outer portions 854' of the leads. Alternatively, the leads may be bent after etching, using a forming die. In yet another lead-forming method, the dielectric interposer, or one of the generally planar dielectric layers constituting the interposer may be provided with features projecting out of the plane of the layers, such as bumps or elongated ridges. The leads may be formed by depositing metal or other conductive material so that it forms leads extending over the projecting features and then removing those portions of the dielectric layer or interposer constituting the projecting features, as by selectively etching the dielectric layer, leaving behind leads which are curved out of the plane. The step of depositing the conductive material to form the leads may be performed by selectively depositing the conductive material using conventional techniques, or by depositing conductive material and selectively etching or otherwise removing conductive material before etching the dielectric layer.

An alternate, generally similar arrangement, includes an interposer incorporates a flexible top layer similar to the top layer 838 of the interposer discussed above with reference to FIGS. 11–14. Terminals and leads are positioned on the first or bottom surface of this layer, so that the terminals face towards the chip when the layer is in position on the chip. The interposer may also include a separate compliant underlayer disposed between the top layer and the chip front surface, and also disposed beneath terminals i.e., between the terminals and the chip. The compliant layer may be positioned on the chip surface, before the top layer, and terminals are positioned on the compliant layer. In this case, the compliant layer may incorporate adhesives at its top and bottom surfaces so as to bind the top layer to the chip. Because the compliant layer is soft, the top layer will remain flexible even when bound to the chip through the compliant layer, and the terminals will still be movable with respect to the contacts in directional parallel to the face of the chip. Alternatively, the compliant layer may be formed from a partially cured elastomer such as a so-called "B-stage" silicone elastomer. After assembly of the top layer, this partially cured material may be more fully cured, as by heating it, which causes the elastomer to bond with the top layer and with the chip surface. In this arrangement, the terminals are disposed beneath the top layer. To provide access to the terminals from the second or top surface of the interposer, the interposer top layer is punctured as applying radiant energy from a radiant energy source such as a laser in registration with the terminals to thereby form holes in alignment with the terminals. Once the holes have been formed, the resulting subassembly can be bonded to a substrate in the same manner as discussed above. These holes may be formed before the interposer is connected to the chip, and indeed may be formed before the terminals are positioned on the interposer. In a further alternative arrangement, the terminals and leads can be provided on the compliant layer itself.

The assembly illustrated in FIG. 16 is similar to the assembly of FIG. 15. However, the outboard portions 8354 of leads 8350 have outward extensions projecting outwardly beyond chip peripheral contacts 8330. These outward extensions are secured to a securement element 8361. Although only one securement element 8361 is visible in FIG. 16, it should be clearly appreciated that a similar securement element 8361 is provided at each edge of interposer 8336 as seen in FIG. 17. Each securement element serves to reinforce and support the outboard portions of the leads, and to prevent undesired bending of the leads in directions parallel to the surfaces of the interposer and chip during assembly. The central terminals 8348 and peripheral contact leads 8350 associated with interposer 8336 are disposed on the first or chip-facing surface 8342 of the interposer top layer 8338. As best seen in FIG. 17, the securement elements 8361 are connected to interposer 8336 by bridge elements 8363. The bridge elements are disposed at spaced-apart locations around the periphery of the interposer. Preferably, the interposer, securement elements and bridge elements are formed as an integral unit. All of these components may be portions of a unitary sheet of dielectric material. Thus, the interposer 8336, bridge elements 8363 and securement elements 8361 may all be formed as part of an elongated tape 8381,(FIG. 17) which may include several interposers 8336, each with its associated securement elements and bridge elements. The tape may also include waste or trim areas 8383. During the various assembly and handling operations, the interposers and chips may be advanced through the process by advancing the tape.

Bridge elements 8363 are disposed at the corners of the interposer. The chip 8320 used in this assembly includes four rows 8332 of peripheral contacts 8330, the rows forming a generally rectangular pattern. However, the rows of peripheral contacts stop short of the corners of this rectangular pattern, so that the corner regions of the pattern are substantially devoid of contacts 8330. Bridge elements 8363 overlie these corner regions, and hence do not cover any of the contacts 8330.

Each securement element 8361 includes a top layer 8301 (FIG. 16). Each securement element has an inboard edge 8365 extending generally parallel to an edge 8346 of interposer so that these parallel edges define an elongated slot 8367 between the securement element and the interposer. Slots 8367 are aligned with the rows 8332 of chip peripheral contacts 8330. The peripheral contact leads 8350, extend across slots 8367, the outward extensions 8354 of these leads being attached to the securement elements 8361, so that each peripheral contact lead 8350 is supported both by the interposer and by the securement element.

Each securement element 8361 has a single row of outside terminals 8372 extending generally parallel to the adjacent slot 8367. Outside terminals 8372 are disposed on the first or chip-facing surface 8369 of the top layer 8301 of each securement element 8361. Outside terminal leads 8374 (FIG. 16) extend inwardly from outside terminals 8372 across slots 8367. Each such outside terminal lead has an inboard end 8376 secured to the interposer 8336. Thus, both the outside terminal leads 8372 and peripheral contact leads 8350 extend across slot 8367. These leads are interspersed with one another along the length of each slot 8367.

Holes 8360 are provided in the interposer and in each securement element top layer in alignment with the central terminals 8348 and outside terminals 8372 so that the central terminals and outside terminals are accessible from the second surfaces of the interposer and securement elements, i.e., from the surface facing away from the chip.

Interposer 8336 includes a compliant bottom layer 8340, and each securement element 8361 may include a compliant bottom layer 8303 (FIG. 16). All of these compliant layers may be similar to the compliant layers discussed above, and may include holes (not shown) to increase their compliance. The compliant layers of the interposer and securement elements may be formed and assembled separately from these components, or may be incorporated in tape 8381.

The leads and terminals may be formed in place on the interposer and on the securement elements by an etching process similar to those described above. A copper or other metallic sheet may be laminated to the dielectric sheet which will ultimately form the interposer top layer 8338 and the securement element top layers 8301, and then covered with a photoresist pattern and etched to form the various terminals and leads. Holes 8360 and slots 8367 may be formed after the terminals and leads, by selectively applying radiant energy such as laser radiation to the sheet to selectively remove portions of the sheet. Alternatively, the slots and holes may be formed before the leads and terminals, as by etching or mechanically punching the dielectric sheet. The leads and terminals may then be formed by applying and selectively etching a metallic layer. In this case, the holes and slots in the dielectric sheet should be temporarily filled with a resist to prevent unwanted etching of the leads and terminals by etchant entering through the holes and slots. Peripheral contact leads 8350 and outside terminal leads 8374 are bent downwardly, toward the bottom of the interposer, within slots 8367. The downward curvature of these leads may be formed by embossing the sheet used to fabricate these leads. Thus, although each lead 8350 and 8374 extends into a slot 8367 from above the bottom layers 83083 and 340 of the securement elements and interposer, each such lead extends to the bottom of the interposer. Before the interposer is assembled to the chip, a set of support elements 8307 is juxtaposed with chip 8320 so that one such support element lies alongside each edge 8309 of the chip. As best seen in FIG. 19, support elements 8307 may be provided as a unitary rectangular ring or box 8311 which may closely surround the edges of the chip. Each support element has a top surface 8313 (FIG. 16) arranged to lie substantially coplanar with the front or top surface 8322 of the chip. Thus, chip 8320 and support elements 8307 may be disposed on a planar carrier 8315, and the thickness of the support elements may be substantially equal to the thickness of the chip.

In assembling the interposer to the chip, the interposer with the various terminals and leads thereon is positioned on the chip so that the slots, and hence the leads, are aligned with the peripheral contacts on the chip. Each securement element 8361 overlies one support element 8307, and is at least partially supported by such element. A bonding tool is then advanced into each slot 8367 and engaged with the peripheral contact leads 8350 and with the outside terminal leads 8372, so as to force each such lead into engagement with one of the peripheral contacts 8330 on the chip. Heat, pressure and ultrasonic energy may be applied through the tool to promote bonding. The arrangement of the leads within the slots greatly facilitates the bonding operation. Bonding tool 8355 may be advanced into one of the slots 8367 and moved along the length of the slot so as to bond all of the leads to all of the peripheral contacts 8330 aligned with that slot. This process may be repeated for each slot 8367. The tool may engage and bond many leads simultaneously.

After the leads have been bonded to the contacts, a low modulus dielectric encapsulant (not shown) is applied. In an alternative assembly process, the compliant layers 8340 and 8303 may be formed by the encapsulant. Thus, the encapsulant may be applied so as to penetrate between the interposer (not shown) and the chip to form compliant layer 8340 between the interposer and the chip. The encapsulant may also penetrate between securement elements 8361 and support elements 8307 to form compliant layers 8303 and penetrate into slots 8367 to cover leads 8374 and 8350. The encapsulant may be introduced under pressure in a liquid or flowable state and then cured. The interposer, chip and associated elements may be disposed in a mold during this process, and the mold may clamp the waste areas 8383 of the sheet or tape (FIG. 17) so as to limit the flow of the encapsulant. The encapsulant may be injected under pressure using standard injection molding technique. After encapsulation, the assembly illustrated in FIGS. 16 and 17 may be separated from the tape and mounted to a substrate in substantially the same way as the assemblies discussed above. Thus, both the outside terminals 8372 and the central terminals 8348 may be bonded to contact pads on the substrate.

The assembly illustrated in FIGS. 16 and 17 provides good reinforcement of the leads during manufacture. Also, the outside terminals provide increased connection capacity. Although the securement elements and outside terminals extend outwardly beyond the peripheral contacts on the chip, this outward extension or "fan-out" is minimal. Preferably, the assembly with securement elements and outside terminals occupies an area in the plane parallel to the chip surface no more than about 1.5 times, and desirably no more than about 1.2 times, the area occupied by the chip itself.

As shown in FIG. 18, an interposer 8436 according to a further embodiment of the invention is provided with securement elements 8461, slots 8467 and outside terminals 8472 similar to the corresponding components discussed above with reference to FIGS. 16 and 17. Outside terminals 8472 are disposed on the second surface of each securement element, i.e., on the surface directed away from the semiconductor chip 8420. Interposer 8436 also has central terminals 8448 on the second surface of the interposer. Each central terminal 8448 is connected to a partial lead 8450 and bonding terminal 8452. Likewise, each outside terminal 8472 is connected to a similar partial lead 8475 and bonding terminal 8477. There are rows of bonding terminals 8452 and 8477 on both sides of each slot 8467. The bonding terminals are connected to the peripheral contacts 8430 on chip 8420 by a wire-bonding operation similar to that discussed above with reference to FIG. 13. Here again, disposition of the bonding terminals in rows facilitates the wire-bonding operation.

Chip 8420 also has central contacts 8431 disposed in the central region of the chip front surface. Interposer 8436 has a hole 8480 encompassing these central contacts. Some of the bonding terminals 8452 associated with certain central terminals 8448 are disposed adjacent the edges of hole 8480. These bonding terminals are connected by wire bonds to the central contacts 8431 of the chip, so that the central contacts as well as the peripheral contacts 8430 will be connected to the substrate through the central terminals 8448 of the interposer.

Assemblies according to the invention may include additional elements for mechanical and electrical protection. Thus, a thin electrically conductive grounding layer such as a metallic layer may be incorporated in the interposer to electrically isolate the terminals from the chip, and to provide better control of impedances in leads extending along the interposer. Such a conductive layer must be separated from the terminals by a dielectric layer. The interposer itself may include multiple layers of terminals and leads separated from one another by intermediate dielectric layers. Such an arrangement allows the leads on the interposer to cross over one another without contacting one another, and allows for more leads and/or wider leads in a given area. The topmost layers of such a multilayer interposer may have holes aligned with the terminals of the lower layers, to provide access to these lower-layer terminals and permit connection to a substrate.

The components illustrated in FIG. 20 are similar to those depicted in FIGS. 16 and 17. Thus, the structure includes an interposer 8736 and securement elements 8761 defining slots 8767 therebetween, only one such securement element and slot being visible in FIG. 20. The outside terminal leads and peripheral leads include portions 8754 extending across the slots. Each such lead portion extends into the slot from above the compliant layer 8703 of the associated securement element and above the compliant layer 8740 of the interposer. In the condition illustrated in FIG. 16, before bonding of lead portions 8754 to terminals 8730 of the chip, these lead portions are substantially planar. That is, they extend substantially in a plane parallel to the plane of interposer 8736 and hence parallel to the plane of chip front surface 8722 when the interposer overlies the chip. Each such lead is curved in this horizontal plane, in the direction of elongation of the slot. Thus, each such lead includes end portions 8780 and 8782 at the edges of the slot, adjacent securement element 8761 and interposer 8736 respectively. Each lead portion 8754 further includes a middle portion 8784 adjacent the center of the slot and overlying one of the peripheral contacts 8730 on chip 8720. Each such middle portion 8784 is offset from the imaginary axis connecting ends 8780 and 8782. As shown in FIG. 20, the offset is in the direction of elongation of slot 8767. During the assembly process, a tool 8786 is advanced into slot 8767 to bond lead portion 8754 to chip peripheral contact 8730. The tool engages the middle portion 8784 of each lead portion, and forces the middle portion downwardly into engagement with chip contact 8730. Because the middle portion is offset from the axis connecting ends 8780 and 8782, this downward motion of the middle portion can be accommodated by a controlled twisting motion of the ends. The middle portion 8784 may also bend downwardly to some degree. This structure provides a controlled downward motion of middle portion 8784. As each lead portion 8754 is retained at ends 8780 and 8782 during this operation, the portions will remain in the desired positions and hence will be properly aligned with chip contact 8730. As all of the middle portions 8784 are offset in the same direction, the offsets in the lead portions do not appreciably increase the required spacings between lead portions 8754 along the length of slot 8767. Moreover, these offsets, lying in the plane of the interposer, can be formed without any separate embossing or bending operation, in the same etching operation used to form the leads. The bonding tool may engage and bond the middle portions of several leads simultaneously.

As illustrated in FIGS. 21 and 22, a connection component 930 for use in providing terminals on the rear or bottom surface of a chip includes a generally cruciform, unitary sheet comprising a generally rectangular backing element 932 and flaps 934 projecting from the edges of the backing element. The sheet has a layered structure including a conductive layer 936, an insulating layer 938 and a further insulating layer 940 on the opposite side of conductive layer 936. Layer 938 defines a first surface 942 of the connection component, whereas layer 940 defines a second surface 944. A set of terminals 946 are disposed on the first surface 942 of the connection component in a central region of the backing element 932. These terminals may be disposed in a rectilinear, grid-like array. Although only a few terminals are shown in FIG. 21 for clarity of illustration, several hundred terminals may be provided on a typical component.

Leads 948 are also formed on the first surface 942 of connection component 930, each such lead being formed integrally with one terminal 946 and electrically connected thereto. Leads 948 extend outwardly, away from backing element 932 on flaps 934, and project to the extremities of the flaps. Thus, each such lead 948 includes a flap portion extending along the associated flap, and a central portion extending from the inner margin of the flap to the associated terminal 946. The thickness of the various layers constituting connection component 930 is greatly exaggerated in FIG. 22 for clarity of illustration. In practice, each of these layers has the minimum thickness required to meet electrical requirements. Desirably, insulating layers 938 and 940 have the minimum thickness required to provide freedom from pinholes and breaks in the insulation, whereas conductive layer 936 and leads 948 have the minimum thickness required for electrical continuity and to provide a relatively low resistance current path. Preferably, each of the insulating layers is less than about 0.5 mm thick, and more preferably, less than about 0.25 mm thick, whereas conductive layer 936 preferably is less than about 0.1 mm thick and each of leads 948 preferably is less than about 0.1 mm thick. Connection component 930 may be formed from substantially the same materials, and in substantially the same manner, as the tape used for tape automated bonding processes. Thus, insulating layers 938 and 940 may incorporate conventional polymeric dielectric materials such as polyimide, whereas layer 936, conductors 948 and terminals 946 may be formed from copper or other metals. The pattern of terminals and conductors may be formed by photochemical etching or deposition techniques similar to those used in the manufacture of tape automated bonding tapes and flexible printed circuits.

Component 930 may be used with a box-like element 950 shown in FIGS. 23 and 24. Box element 950 includes four support elements or walls 952 arranged to form a generally rectangular ring and a floor element 954 extending across the interior of this ring so that walls 952 and floor element 954 cooperatively define a rectilinear closed-bottom box having an interior space 956 open at the top (the side visible in FIG. 23). The box has length l and width w slightly larger than the corresponding dimensions of chip 920, whereas the depth d of the box desirably is slightly greater than the thickness of chip 920, i.e., slightly greater than the distance between surfaces 922 and 924 of the chip. Each support member or wall 952 has a projection 958 extending downwardly, beneath floor element 954, so that projections 958 and floor element 954 cooperatively define a further open interior space 960 on the bottom side of floor element 954. The floor element has several holes or apertures 962 extending through it, between spaces 956 and 960. Space 960 is shallower than space 956. Box element 950 may be formed from substantially rigid materials such as thermoplastics or thermosetting polymers, glass, ceramics glass-ceramic materials, polymer-matrix composites and metal-matrix composites, and metals, metals and polymers being preferred.

In a fabrication process according to one aspect of the invention, a resilient, compliant layer 964 (FIG. 25) formed from a relatively low elastic modulus material is provided in the lower or downwardly facing space 960 of box element 950. Preferably, this low-modulus material has elastic properties (including modulus of elasticity) comparable to those of soft rubber, about 20 to about 70 Shore A durometer. Compliant layer 964 has holes 966 interspersed with masses 968 of the low modulus material. Layer 964 may be formed from a sheet of solid elastomer by punching or perforating to form holes 966, and then inserted into the lower space 960 of box element 950 and fastened in place by adhesive material 970 extending through holes 962 in the floor element 954 of box element 950. A portion of this adhesive material may partially or fully coat the top surface of floor element 954 so as to provide some degree of surface adhesion or tack on the top surface of the floor element. Alternatively, compliant layer 964 may be formed by molding in place within the lower space of the box element. Thus, the elastomeric material may be introduced in a fluid condition and chemically or heat cured to a resilient state. Where the compliant layer 964 is formed in this fashion, some portion of the elastomeric material may protrude through holes 962 in much the same way as adhesive material 970. This serves to fasten the compliant layer to the undersurface of the floor element. The compliant layer may also be applied by silk-screening. In yet another alternative procedure, the compliant layer can simply be placed within the lower space of the box element without fastening it to the box element.

In the next stage of the assembly process, connection component 930 is juxtaposed with box element 950 so that the second surface 44 of the connection component confronts the exposed or bottom surface of compliant layer 964, and so that the backing element 932, is aligned with floor element 954 and compliant layer 964. At this stage of the process, each flap 934 of connection component 930 projects outwardly beyond walls 952 and extends across the lower extremity of one projection 958. Thus, the central region of the backing element bearing terminals 946 is aligned with compliant layer 964, the terminals facing downwardly, away from the compliant layer and floor element 954. The arrangement of masses 968 in compliant layer 964 is selected to match the arrangement of terminals 946. As best illustrated in FIG. 26 (showing a later stage of the process) each terminal 946 is aligned with a mass 968 of the low modulus material whereas the holes 966 in layer 964 are aligned with spaces between terminals 946.

In the next stage of the manufacturing process, flaps 934 are bent upwardly alongside the walls or support elements 952 of box element 950. Thus, each flap 934 and the flap portions 48 of the conductors on such flap extends upwardly alongside the associated wall 952. The extremity of each flap is bent inwardly over the uppermost margin of the associated wall 952. Thus, as seen in FIG. 25, the extremity of flap 934a is bent inwardly at the upper extremity of wall 952a. Likewise, flap 934b extends upwardly along side wall 952b as illustrated in FIG. 26 and is bent inwardly over the upper most extremity of wall 952b. Thus, the extremities of conductors 948 adjacent the edges of the flaps are disposed along the top edges of walls 952, remote from floor element 954 around the top opening of space 956. Conductors 948 extend downwardly alongside the walls of the box element to terminals 946, which are disposed beneath the box element. As connecting element 930 and hence flaps 934 are flexible, the bending operation can be performed readily. The extremities of the flaps overlying the top edges of walls 950 are bonded to the tops of the walls.

A layer of a preferably flexible dielectric material is applied as a solder mask layer 972 covering the downwardly facing first surface of backing element 932. Solder mask layer 972 is provided with apertures 974 aligned with terminals 946 of the backing element. This solder mask layer may be formed by molding or by selective curing of an elastomeric material. For example, the material may be applied in a flowable, uncured state and then cured by radiant energy. The radiant energy may be applied selectively so as to cure all portions of the layer except those portions overlying the terminals 946. Subsequent to this selective curing, the uncured portions may be removed. Alternatively, the solder mask may be applied as a solid layer and punctured to expose terminals 946. As discussed further hereinbelow, solder mask layer 972 and may be omitted in certain cases.

The assembly at this stage constitutes a receptacle adapted to receive a semiconductor chip. These receptacles can be prefabricated in mass production and distributed to semiconductor chip manufacturers and users. Alternatively, the receptacle can be fabricated immediately before it is united with the semiconductor chip.

The receptacle is united with a semiconductor chip 920 by first placing chip 920 (FIG. 26) into the top or upper space 956 of box element 950, so that the front face 922 of the chip faces upwardly, away from floor element 954 and backing element 932. The chip 920 may be temporarily retained in position within the receptacle by the adhesive 970 on the top surface of floor element 954. In this position, the edges 926 of the chip confront the support elements or walls 952 of the box element. Chip 920 is of substantially the same type as illustrated in FIG. 11. This, chip 920 has contacts 928 disposed on its front surface 922, the contacts being arranged in rows adjacent the edges 926 of the chip. Flaps 934, and hence lead portions 948 on the flaps, extend upwardly alongside edges 926 of the chip, so that the leads on each such flap extend to the vicinity of one row of contacts 928 on the chip. Each row of contacts 928 is positioned immediately adjacent to the extremities of leads 948 on one of flaps 934. The front surface 922 of the chip, and hence contacts 928, are disposed at approximately the same height above floor element 954 as are the extremities of leads 948, although the extremities of the leads may be elevated slightly above surface 922.

While the chip is in this position, the contacts 928 are electrically connected to leads 948 by wire bonding the contacts to the adjacent extremities of the leads. In the wire bonding operation, fine wires 974 are connected between contacts 928 and lead portions 948, thereby electrically connecting each lead portion 948 to one contact 928 in the adjacent row of contacts. In effect, wires 974 merge with lead portions 948 to form a composite lead extending from terminal 928, around one wall element 952 and downwardly alongside the edge 926 of the chip to one terminal 946 on the backing element 932. The process of wire bonding per se is well known in the electronics art and need not be described in detail herein. Briefly, this process utilizes a movable wire dispensing and bonding head. The head is brought into engagement with one of the elements to be connected and an end of a fine wire is bonded to such element. The head is then moved while paying out the wire until it reaches the other element to be connected, whereupon the wire is bonded to such other element and cut, leaving the wire in place. Wire bonding processes typically are controlled by detecting the relative position and orientation of the components to be connected and then controlling the wiring bonding head accordingly so as to bring the wires into contact with the desired elements. This allows the desired interconnections to be made even where the relative positions of the components to be connected differ from the nominal positions. Typically, the relative positions and orientations of the components are detected by robot vision systems, such as television-based pattern recognition systems. These techniques desirably are used in the wire bonding step of the present method. Where such techniques are employed, it is not essential to provide great precision in the positioning of chip 920 or in the positioning of lead portions 948. This minimizes the need for close control of the bending operation discussed above.

After the bonding wires 974 have been attached, a pad 975 of a soft, thermally conductive material, such as silicone with a thermally conductive filler, is placed atop the front surface 922 of the chip. The pad covers the central portion of the chip front surface, remote from contacts 918 and wires 974. A layer of an encapsulant 976 is applied over the front face 922 of the chip. The encapsulant, which desirably is a soft, dielectric material covers the bonding wires 974, the contacts 928 and the extremities of the lead portions 948 disposed atop the walls 952. The encapsulant desirably also penetrates into and at least partially fills spaces between the edges 926 of the chip and the confronting walls 952 of the box element. A cover 978 is then placed over the top of the assembly. Cover 978 may be a box-like metallic element, commonly referred to as a "chip can", or else may be molded in a place on the assembly from a polymeric material such as an epoxy. Cover 978 may be united with the periphery of the solder mass layer 972 so as to seal the assembly against subsequent contamination. Encapsulant 976 contacts the front surface 922 of the chip and also contacts cover 978, thus providing a path for heat transmission from the chip to the cover. This facilitates heat transfer from the chip to the surroundings, outside the assembly, during operation of the chip. Cover 978 also contacts layer 975, further facilitating heat transfer.

The assembly desirably is tested before being used as part of a larger assembly. The assembly desirably is tested in substantially the same way as discussed above using an electrical testing fixture having numerous pins or probes connected to an appropriate test circuit and rigidly mounted to a common fixture or support. To provide a reliable test, the numerous pins or probes on the test fixture must be held in contact with the respective terminals 946 at the same time. In this arrangement as well terminals 946 can be independently displaced towards chip 922. Such displacement permits continued movement of the test fixture and assembly towards one another, until all of the pins are engaged with their respective terminals 946. Each terminal 946 will be biased against the associated pin of the test fixture by the resilience of compliant layer. This assures reliable contact and a reliable test. As discussed above, the configuration of compliant layer 964 contributes to this action. Each mass 968 of low modulus material provides backing and support for the terminal 946 aligned therewith. As the pins of the test fixture engage the terminals, each mass 968 is compressed in the vertical direction and therefore tends to bulge in horizontal directions, parallel to the plane of the chip. Holes 966 provides space for such bulging. Compliant layer 964 need only provide for sufficient movement of terminals 946 to accommodate tolerances in the test equipment and in the assembly itself. Typically, about 0.0005 inch (0.125 mm) or less compliance is sufficient. For example, compliant layer 964 may be about 0.008 inch (0.2 mm) thick.

After testing, the assembly is mounted to a substrate 988 (FIG. 26) having electrical contact pads 990, using techniques similar to those used for mounting the assemblies discussed above. For example, the assembly may be placed on the substrate so that the apertures 974 in solder mass layer 972 and terminals 946 are aligned with the contact pads 990 of the substrate. Masses of an electrically conductive bonding material 991 such as a solder or an electrically conductive adhesive may be disposed between the terminals 946 and the contact pads 990 of the substrate. These masses may be caused to flow and to bond with the terminals and contact pads, in the same manner as discussed above.

Because terminals 946 are disposed at substantial center to center distances, standard surface mount techniques can be used without difficulty. In this regard, it should be appreciated that terminals 946 are distributed over an area approximately equal to the entire area of the chip bottom surface 924. By contrast, contacts 928 of the chip itself are concentrated in rows around the periphery. Thus, the center to center distances between the terminals 946 may be substantially greater than the center to center distances between contacts 928. In typical applications, electrical connections for a chip having a substantial number of input and output terminals, commonly referred to as a "I/O count" can be achieved with 10–25 mil (250–625 micrometer) center to center distances.

The composite leads including lead portions 948 and bond wire 974 provide reliable interconnections between contacts 928 and terminals 946. Because the electrically conductive layer 936 of connecting element 930 extends upwardly, alongside the chip with lead portions 948, lead portions 948 have predictable, controlled impedance. This reliable electrical performance is also enhanced by the predictable geometric configuration of lead portions 948. Each lead portion 948 has a predetermined width and is located in a predetermined position relative to the adjacent lead portions.

These relative positions and widths are fixed when the connecting element 930 is made. Although this composite leads do include bonding wires 974, these bonding wires are so short that they do not introduce appreciable unpredictable capacitance or inducence.

The assembly thus provides a compact, rugged and economical chip mounting. The entire assembly occupies little more area (in the plane of the chip) than the chip itself. As the leads and flaps extend alongside the chip, in close proximity to the edges of the chip, they do not substantially increase the area occupied by the assembly. Also, because the assembly can be pretested before mounting to the substrate, high quality can be assured. The methods and structure discussed above can be varied in numerous ways. Also, solder mask layer 972 may be applied at any stage in the process. If desired, this layer could be formed as part of connection element 930 or applied after the remaining components of the assembly, as by molding in place so that solder mass layer 932 contacts cover 978.

The configuration of box element 950 can be varied from that illustrated. The floor element 954 can be omitted entirely, or else the floor element may include only small tabs projecting inwardly from the walls 952 so as to support the chip only at its edges or corners. In either case compliant layer 964 will be in direct engagement with the bottom surface of the chip and with the backing element. Alternatively, the holes 962 in the floor element 954 may be omitted. The downward projections 958 of the walls 952 may be omitted, so that the walls terminate flush with the floor element or flush with the bottom surface of the chip if the floor element is omitted. The bottom edges of the walls may be provided with chamfers or radii to prevent damage to the connection component 930 when the flaps are bent upwardly. The box element may be provided with supports, such as legs at the corners of the box element, projecting downwardly for engagement with the substrate. In this case, the box element will serve to support the chip above the substrate, thereby preventing crushing of the solder joints during manufacturing procedures or in use. This arrangement is particularly useful where a heat sink is forcibly held in engagement with the front surface of the chip. Also, the box element can be employed as part of a hermetic sealing arrangement around the chip.

The compliant layer 964 disposed adjacent the backing element can extend outwardly to the outer surfaces of the walls or support elements 952, so that a portion of the compliant layer is interposed between the lower edge of each such wall or support element and the backing element. This arrangement is particularly useful when some of the terminals 946 are disposed on that portion of the backing element aligned with the bottom edges of the walls.

Where the coefficient of thermal expansion of the box element differs substantially from the coefficient of thermal expansion of the chip, the bonding wires 974 can flex to compensate for relative movement of the chip and the lead portions at the extremities of the flaps, overlying the top edges of the walls. In those cases where the flap portions of leads 948 are bonded directly to the contacts on the chip as discussed below, those flap portions of the leads may be flexible to provide similar compensation. Where the coefficient of thermal expansion of the box element differs substantially from that of the substrate, the backing element preferably is not bonded to the bottom of the box element except through the compliant layer. This permits the flaps to flex and the backing element to move relative to the box element and absorb differential thermal expansion.

The configuration of the heat transfer elements can be varied considerably. Thus, the thermally conductive pad or layer 975 may include a metallic slab bonded to the front or top surface of the chip. Such a metallic heat sink may include fins, plates or projections to further facilitate heat transfer. A plurality of chips can be engaged with the same heat sink. Essentially any heat sink which can be used with conventional face-up chip assemblies can be employed.

The backing element and flaps may include more than one layer of leads, so as to accomodate particularly complex interconnection requirements. Also, more than one flap may be provided at each edge of the backing element, and these multiple flaps may extend in superposed relation along the edge of the chip or along the wall of the box element.

As illustrated in FIG. 27, the box element may be omitted. Thus, the flaps 9134 of connecting element 9130 may be folded upwardly, alongside the edges 9126 of chip 9120, without intervening wall members. Also, compliant layer 9164 may be disposed directly between backing element 9132 and the bottom or rear surface 9124 of the chip 9120, without any intervening floor element. In the arrangement shown in FIG. 27, each flap 9134 not only extends upwardly along the side the edge 9126 of the chip but also extends inwardly, over a marginal portion of the chip front surface 9122 adjacent the edge 9126. Each flap has a slot 9137 overlying a row of contacts 9128 on the chip. The extremities 9149 of lead portions 9148 extend across this slot and hence overlie the chip contacts 9128. In the assembly process, extremities 9149 can be bonded directly to terminals 9128 by techniques similar to those discussed above with reference to FIGS. 16 and 20. To facilitate the bonding operation, extremities 9149 may be curved in directions parallel to the length of slot 9137 so as to permit them to deflect downwardly and engage contacts 9128 more readily under the influence of bonding tool 9151. In the manufacturing process, the connecting element 9130 and compliant layer 9164 are assembled to chip 9120, and the flaps 9134 of the connecting element are folded directly upwardly, alongside the edges 9126 of the chip. The extremities of flaps are then folded inwardly over the front surface of the chip. The assembly illustrated in FIG. 27 may also be provided with a solder mask layer, housing and encapsulant as discussed above.

The arrangement of FIG. 28 is similar to that discussed above with reference to FIG. 27, in that the extremities of flaps 9234 are folded over the front surface 9222 of the chip, thereby positioning the extremities 9249 of lead portions 9248 over contacts 228 on the chip. Here, however, the connecting element includes vias 9251 extending through it from beneath each lead extremity 9249 to the second surface 9244 of the flap, i.e., the surface opposite from the first or lead-bearing surface 9242. Each such via is filled with an electrically conductive bonding material such as a thermocompression bonding alloy 9253. Bonding material 9253 is activated by heat or pressure, using conventional bonding techniques, to bond each lead extremity 9249 to one contact 9228 on the chip. The electrically conductive layer 9236 of the connecting element terminates remote from vias 9251, so that the electrically conductive layer does not make an electrical connection with the conductive material 9253. If desired, the conductive layer 9236 may be extended to one or a few of vias 9251 so as to provide a ground connection to layer 9236. That is, one of leads 9248 may be connected to a terminal (not shown) which in turn is connected to a ground on the substrate, and layer 9236 may be grounded through that lead.

As an alternative to thermocompression or other conventional bonding techniques, the leads can be connected to the contacts on the chip by using a so-called "Z-conducting"

adhesive. Such materials ordinarily include electrically conductive particles selected so that when the material is applied in a thin layer, it will have appreciable electrical conductivity in the direction through the layer but only insignificant conductivity in directions parallel to the layer. Z-conducting adhesives may also be used to connect the leads of the interposers discussed above to the contacts of the chips.

As illustrated in FIG. 29, a sub-assembly in accordance with the present invention may be mounted on another chip. For example, as illustrated in FIG. 29 contacts 9328 on the front surface 9322 of chip 9320 are connected, through terminals 9346, to contacts 9391 of a semiconductor chip 9393. Thus, chip 9393 itself serves as the substrate for mounting the assembly incorporating chip 9320. Chip 9393 in turn is connected via conventional wire bond leads 9395 to a further substrate and hence to other electronic elements. Conversely, a further chip 9377 is mounted so as to overlie the front surface of chip 9320. An interposer 9379 is disposed on chip front surface 9322. This interposer has terminals 9381 connected to some of the contacts 9328 on the chip front surface via flexible leads. The interposer itself is flexible and includes a compliant layer 9383 disposed between terminals 9381. Those terminals in turn are connected to terminals 9356 of a further sub-assembly, which in turn are connected to contacts 9338 of chip 9377. Thus, chips 9320 and 9377 are interconnected in a stacked circuit assembly which in turn is mounted on chip 9393. Any number of chips can be interconnected in such a stacked assembly.

In an assembly according to a further embodiment of the invention, illustrated in FIG. 30, the orientation of the sheet-like connection component is reversed. That is, the lead-bearing or first surface 9442 faces toward chip 9420. Terminals 9446 are exposed through holes 9473 extending through the insulating layers 9440 and 9438. The conductive layer 9436 disposed between these insulating layers terminates remote from holes 9473, so that the two insulating layers merge with one another at the boundaries of the holes and insulate the holes from layer 9436. Thus, bonding material can be introduced in holes 9437 so as to connect terminals 9446 to a substrate. Also in this arrangement, the extremities 9435 of flaps 9434 are bent outwardly, away from the chip, and the walls or support elements 9452 are disposed outside of the flaps. That is, the flaps lie between support elements 9452 and the chip. Compliant layer 9464 immediately underlies terminals 9446

In a further variant (not shown) the support elements or walls can be integral with the connecting element, and particularly can be integral with the flaps. Thus, the connecting element can have relatively stiff regions constituting the flaps and a flexible region constituting the central or backing element. The stiff regions constituting the flaps can be bent upwardly so as to form a self-supporting structure. As in the arrangement discussed above, this provides a generally box-like or cup-like structure having an open top with lead portions disposed around the periphery of the opening for receiving a chip and connecting thereto.

As will be readily appreciated, numerous further variations and combinations of the features discussed above can be utilized without departing from the present invention as defined by the claims. In one such variant (not shown) the backing element is provided substantially as discussed above, but the flaps and the lead portions on the flaps are omitted. In this arrangement, the bonding wires constitute the principal portion of each lead. The bonding wires extend downwardly, alongside the edges of the chip, to the backing element and join the backing element adjacent to the rear or bottom face of the chip. In this arrangement, the bonding wires constitute the leads extending alongside the edges of the chip. This arrangement is distinctly less preferred because it does not offer the same degree of control over lead impedance as the other arrangements discussed above. Thus, the foregoing descriptions of the preferred embodiments should be taken by way of illustration rather than by way of limitation of the invention defined by the claims.

What is claimed is:

1. A method of making a semiconductor chip assembly comprising the steps of:
   (a) providing a semiconductor chip having a front surface defining the top of the chip, said front surface including a central region and a peripheral region surrounding said central region, whereby said central region is disposed inwardly of said peripheral region, said chip having central contacts disposed in said central region of said front surface;
   (b) assembling a dielectric element to said chip so that said dielectric element overlies said chip front surface, said dielectric element having a first surface facing towards said chip and a second surface facing away from said chip, a plurality of terminals disposed on said dielectric element and a hole encompassing said central contacts with an edge bounding said hole;
   (c) connecting a plurality of central contact leads between at least some of said central contacts and at least some of said terminals on said dielectric element.

2. A method as claimed in claim 1, wherein said terminals are moveable with respect to said central contacts so as to compensate for thermal expansion of said chip.

3. A method as claimed in claim 1, wherein each said central contact lead includes a terminal end integrally formed with one of said terminals and a contact end extending to one of said central contacts.

4. A method as claimed in claim 3, wherein said central contact leads are flexible.

5. A method as claimed in claim 1, wherein said dielectric element includes a compliant layer of a low modulus material, said compliant layer being disposed beneath said terminals.

6. A method as claimed in claim 5, wherein said dielectric element further includes a thin, flexible top layer formed from a material selected from the group consisting of thermoset and thermoplastic polymers overlying said compliant layer and defining said second surface of said dielectric element.

7. A method as claimed in claim 1, wherein some of said plurality of terminals are disposed adjacent the edge bounding said hole.

8. A method as claimed in claim 1, wherein said plurality of terminals are disposed at said second surface of said dielectric element.

\* \* \* \* \*

UNITED STATES PATENT AND TRADEMARK OFFICE
CERTIFICATE OF CORRECTION

PATENT NO.    :   5,950,304
DATED         :   September 14, 1999
INVENTOR(S)   :   Khandros, et al.

It is certified that error appears in the above-identified patent and that said Letters Patent is hereby corrected as shown below:

Column 1, line 67, "devise" should read -- device --.

Column 9, line 54, "plane" should read -- plain --.

Column 9, line 67, "23" should read -- 22 --.

Column 11, line 37, after "may" insert -- be --.

Column 13, line 29, "method" should read -- methods --.

Column 13, line 60, "So" should read -- 50 --.

Column 17, line 65, "a" should read -- an --.

Column 18, line 3, after "chip" insert -- . --.

Column 21, line 11, after "830'", insert -- . -

Column 21, line 67, "incorporates" should read -- incorporating --.

UNITED STATES PATENT AND TRADEMARK OFFICE
CERTIFICATE OF CORRECTION

PATENT NO. : 5,950,304
DATED : September 14, 1999
INVENTOR(S) : Khandros, et al.

It is certified that error appears in the above-identified patent and that said Letters Patent is hereby corrected as shown below:

Column 22, line 25, "as" should read -- by --.

Column 23, line 10, after "of" insert -- the --.

Column 24, line 2, "83083" should read -- 8303 --.

Column 24, line 2, "340" should read -- 8340\WIO --.

Column 26, line 37, "are" should read -- is --.

Column 28, line 17, "48" should read -- 948 --.

Column 28, line 17, "extends" should read -- extend --.

Column 28, line 48, cancel the word "and".

Column 28, line 65, "this" should read -- thus --.

Column 29, line 53, after "material" insert -- , --.

Column 30, line 26, "provides" should read -- provide --.

Column 30, line 56, "a" should read -- an --.

Column 31, line 2, "this" should read -- the --.

UNITED STATES PATENT AND TRADEMARK OFFICE
CERTIFICATE OF CORRECTION

PATENT NO. : 5,950,304
DATED : September 14, 1999
INVENTOR(S) : Khandros, et al.

It is certified that error appears in the above-identified patent and that said Letters Patent is hereby corrected as shown below:

Column 32, line 21, after "side", insert -- of --.

Column 32, line 46, "228" should read -- 9228 --.

Column 33, line 47, after "9446", insert -- . --.

Signed and Sealed this

Ninth Day of May, 2000

Attest:

Q. TODD DICKINSON

*Attesting Officer*   *Director of Patents and Trademarks*